(12) United States Patent
Matsuo

(10) Patent No.: US 8,473,291 B2
(45) Date of Patent: Jun. 25, 2013

(54) SOUND PROCESSING APPARATUS, APPARATUS AND METHOD FOR CONTROLLING GAIN, AND COMPUTER PROGRAM

(75) Inventor: Naoshi Matsuo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1261 days.

(21) Appl. No.: 12/232,177

(22) Filed: Sep. 11, 2008

(65) Prior Publication Data

US 2009/0076810 A1 Mar. 19, 2009

(30) Foreign Application Priority Data

Sep. 13, 2007 (JP) ................................. 2007-238144

(51) Int. Cl.
*G10L 21/00* (2006.01)

(52) U.S. Cl.
USPC ................ 704/233; 704/225; 381/10; 381/28

(58) Field of Classification Search
USPC ................ 704/225, 233; 381/10, 28
See application file for complete search history.

(56) References Cited

U.S. PATENT DOCUMENTS

| | | | | |
|---|---|---|---|---|
| 5,440,639 A | * | 8/1995 | Suzuki et al. | 381/17 |
| 5,530,760 A | * | 6/1996 | Paisley | 381/27 |
| 5,809,472 A | * | 9/1998 | Morrison | 704/500 |
| 5,852,800 A | * | 12/1998 | Modeste et al. | 704/270.1 |

FOREIGN PATENT DOCUMENTS

JP 2000-105599 4/2000

* cited by examiner

*Primary Examiner* — Daniel D Abebe
(74) *Attorney, Agent, or Firm* — Staas & Halsey LLP

(57) ABSTRACT

A sound processing apparatus is provided for estimating the power of background noise using a directional sound receiving technology using a plurality of sound receiving units, computing a gain control value on the basis of the estimated power of background noise and a predetermined power target value, and outputting the gain control value, so that a delay time of starting gain control can be reduced, and a slow response of a speech recognition application program or degradation of the speech quality of a voice communication program can be prevented.

10 Claims, 22 Drawing Sheets

SOUND PROCESSING APPARATUS, APPARATUS AND METHOD FOR CONTROLLING GAIN, AND COMPUTER PROGRAM

BACKGROUND OF THE INVENTION

1. Field of the Invention

The present invention relates to an sound processing apparatus and, in particular, to a sound processing apparatus for amplifying a sound signal input from a microphone and processing the sound signal, a gain control apparatus for controlling the amplification gain of the sound signal, a gain control method for use in the sound processing apparatus and the gain control apparatus, and a program product storing a computer program for executing a program for the sound processing apparatus and the gain control apparatus.

2. Description of the Related Art

In recent years, the use of apparatuses has become widespread that receive sound with a microphone, convert the sound into a sound signal, amplify the sound signal to an audio level appropriate for speech recognition processing, and performs speech recognition processing on the speech of a speaker on the basis of the amplified sound signal. When the audio level (power) is excessively increased, the sound signal is saturated. In contrast, an excessively decreased audio level results in erroneous speech recognition. Accordingly, in order to obtain an appropriate audio level, it is important to develop a technology for controlling the amplification gain.

FIG. 22 is a functional block diagram of an existing sound processing apparatus 1000. The existing sound processing apparatus 1000 includes a sound receiving unit 1010 for receiving a sound arriving from the outside, such as speech uttered by a speaker and noise, an amplifier unit 1020, such as a variable gain amplifier, for amplifying a sound signal generated by the sound receiving unit 1010, an analog-to-digital (A/D) converter 1030 for converting the analog sound signal amplified by the amplifier unit 1020, and a control unit 1040, such as a digital signal processor (DSP).

The control unit 1040 includes speech section detecting part 1041 for detecting a section that contains speech uttered by a speaker from the sound signal converted to a digital signal and application part 1042 for executing a speech recognition process on the basis of the speech contained in the detected section. The control unit 1040 further includes power estimating part 1043 for estimating an audio level (power) on the basis of the sound signal in the detected section and gain deriving part 1044 for computing a control value of the gain of the amplifier unit 1020 on the basis of the estimated audio level. The computed gain control value is output to the amplifier unit 1020, which amplifies the sound signal on the basis of the gain control value.

By controlling the gain for amplifying the sound signal in the amplifier unit 1020 so as to adjust the sensitivity of the sound receiving unit 1010, the audio level of the sound signal required for executing a speech recognition application program can be made close to a target value under various noise environments. This feature is referred to as "automatic gain control (AGC)". The AGC is used for pre-processing when an application such as a speech recognition application program is executed.

Japanese Laid-open Patent Publication No. 2000-105599 describes a method for separating noise from speech in a signal containing the noise and the speech, as one of technologies relating to sound processing.

SUMMARY

However, in existing sound processing apparatuses, in order to determine a section containing speech uttered by a speaker, a period of time of several tens to several hundreds of milliseconds is required. Accordingly, a delay disadvantageously occurs before gain control starts. During the delay, the audio level may enter an inappropriate state. Thus, the sound signal may be saturated, or a speech misrecognition error may occur.

To address this issue, a method for accumulating (buffering) sound signals before the speech section is determined and gain control is performed is proposed. However, in this method, a processing delay occurs. Therefore, a response delay of a speech recognition application program may occur, or the speech quality of a communication application program may be degraded.

Accordingly, it is an object of an embodiment of the present invention to provide a sound processing apparatus for estimating the power of background noise using a directional sound receiving technology using a plurality of sound receiving units, computing a gain control value on the basis of the estimated power of background noise and a predetermined power target value, and outputting the gain control value, so that a delay time of starting gain control can be reduced, and a slow response of a speech recognition application program or degradation of the speech quality of a voice communication program can be prevented. It is a further object of an embodiment of the present invention to provide a gain control apparatus for controlling a gain relating to amplification of a sound signal, a method for controlling a gain for use in the sound processing apparatus and the gain control apparatus, and a computer program for realizing the sound processing apparatus and the gain control apparatus.

According to an embodiment, a sound processing apparatus having the following configuration is provided. The sound processing apparatus includes a plurality of sound receiving units for converting an input sound to sound signals, a plurality of amplifier units for amplifying the sound signals with a predefined gain control value, a separating unit for separating a first sound signal based on a sound arriving from a predetermined target direction from a second sound signal based on sounds arriving from directions other than the target direction on the basis of the sound signals, an estimating unit for estimating a power of background noise contained in the sound signals on the basis of a correlation between the first and second sound signals, and a deriving unit for computing the gain control value output to the plurality of amplifier units on the basis of the estimated power of background noise and a predetermined power target value.

The sound processing apparatus can compute a gain control value by smoothing a time variation in a difference between the estimated power of background noise and the power target value.

In addition, the sound processing apparatus can determine a time constant representing the degree of smoothness on the basis of a size relationship between the computed difference and a previously obtained gain control value and smooth a time variation in the difference on the basis of the determined time constant.

Furthermore, the deriving unit can be configured so as to compute the gain control value only when the estimated power of background noise is greater than the power target value or only when the estimated power of background noise is less than the power target value.

The sound processing apparatus can include a selecting unit for selecting one of the sound signals output from the plurality of amplifier units of the sound processing apparatus as a processing target on the basis of target values of the gains of the amplifier units and prestored gains of the amplifier units.

According to another embodiment of the present invention, a method for controlling a gain is provided. The method includes the operations of converting input audio information to corresponding sound signals, amplifying the sound signals with a predefined gain control value, separating a first sound signal based on a sound arriving from a predetermined target direction from a second sound signal based on sounds arriving from directions other than the target direction on the basis of the sound signals, estimating a power of background noise contained in the sound signals on the basis of a correlation between the first and second sound signals, and computing the gain control value on the basis of the estimated power of background noise and a predetermined power target value.

According to an embodiment of the present invention, since the correlation in a noise section containing no speech is high, a gain control value output to the amplifier unit is computed on the basis of the estimated power of background noise. In this way, the gain control value is computed, and control is performed substantially in real time. Accordingly, a delay time before the gain control is started can be reduced. In addition, since the sound signals before the gain control is started need not be accumulated, a delay of response of a speech recognition application program or degradation of the speech quality of a voice communication program can be reduced.

Furthermore, by smoothing the time variation, an abrupt change in the gain can be prevented. Thus, post-processing, such as speech recognition, can be stabilized. In particular, when the gain control values are discretely obtained on the basis of sound signals at predetermined time intervals, a significant change in the gain control value in a stepwise manner can be prevented without decreasing the time interval.

Still furthermore, by determining the time constant dynamically, the follow-up performance of the gain control value following the power target value can be controlled.

In addition, for example, when a speech switch of a car navigation system is pressed in order to stop noise caused by a car audio unit and, subsequently, a user start speaking, only control for increasing the gain is performed. Thus, an excessive decrease in the sensitivity of the sound receiving unit due to the increase in the gain can be prevented. Accordingly, degradation of the quality of post-processing, such as a speech recognition process or a voice communication process, can be prevented. Furthermore, for example, when the sound processing apparatus is used in an environment in which a noise level frequently changes, only control for decreasing the gain is performed. Thus, saturation of a sound signal can be prevented, since an excessive increase in an audio level due to an increase in the gain does not occur.

Yet still furthermore, by adjusting the gain control value so that the control width of the gain is within the control range, control can be performed within the control range of the amplifier unit.

Yet still furthermore, since the correlation in a noise section containing no speech is high, a target value of the gain can be computed on the basis of the estimated power of background noise, and a sound signal is selected so that the computed gain can be obtained. In this way, computation of the gain target value and control are performed substantially in real time. Therefore, a delay time before the gain control is started can be reduced. In addition, since the sound signals before the gain control is started need not be accumulated, a delay of response of a speech recognition application program or degradation of the speech quality of a voice communication program can be reduced.

DESCRIPTION OF THE PREFERRED EMBODIMENTS

Various exemplary embodiment of the present invention are described below with reference to the accompanying drawings.

First Exemplary Embodiment

Figure 1:
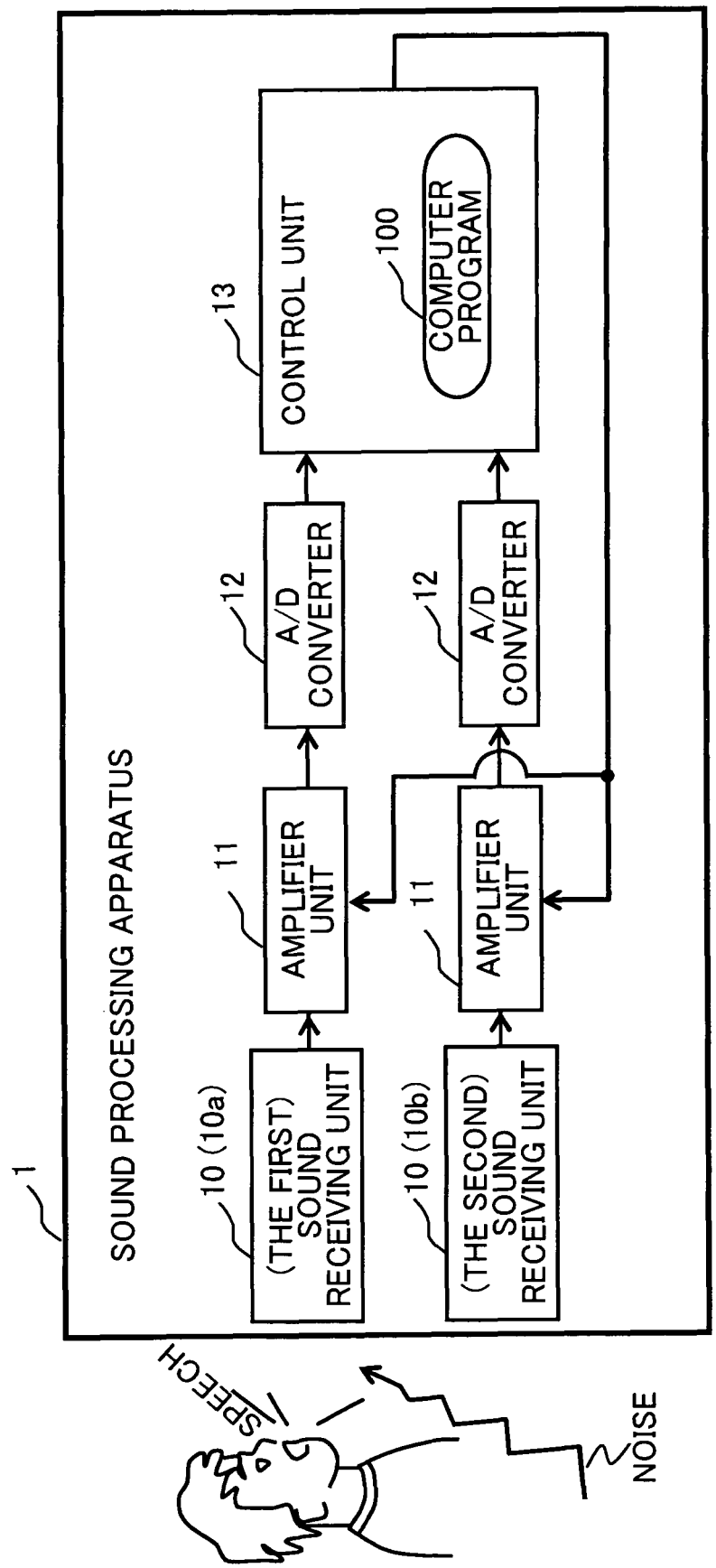
FIG. 1 is a block diagram of an exemplary hardware configuration of a sound processing apparatus according to a first exemplary embodiment of the present invention.

FIG. 1 is a block diagram of an exemplary hardware configuration of a sound processing apparatus according to a first exemplary embodiment of the present invention. A sound processing apparatus 1 includes a plurality of sound receiving units 10, 10, . . . for converting an input sound containing speech uttered by a speaker and noise to analog sound signals, amplifier units 11, 11, . . . (e.g., variable gain amplifiers) for amplifying the sound signals, A/D converters 12, 12, . . . for converting the analog sound signals to digital signals, and a control unit 13, such as a digital signal processor (DSP).

The amplifier unit 11 amplifies a sound signal with an amplification degree based on a preset gain control value. Each of the A/D converters 12 samples the analog sound signal at a sampling frequency of, for example, 8000 Hz or 12000 Hz so as to convert the analog sound signal to a digital signal. The A/D converter 12 then outputs the digital sound signal to the control unit 13. The sound processing apparatus 1 includes a plurality of sets of the sound receiving unit 10, the amplifier unit 11, and the A/D converter 12. Hereinafter, a configuration including two sets of the sound receiving unit 10, the amplifier unit 11, and the A/D converter 12 is described. In addition, these two sound receiving units 10 and 10 are referred to as a "first sound receiving unit 10a" and a "second sound receiving unit 10b" as needed.

The control unit 13 is an arithmetic circuit including firmware, such as a computer program 100 and data. The control unit 13 executes the computer program 100 embedded in the form of firmware. The sound processing apparatus 1 further includes a variety of mechanisms, such as a processing mechanism, an operation unit, and an output mechanism so as to function as a system, such as a car navigation system. Alternatively, the sound processing apparatus 1 may be achieved by using a computer included in a car navigation system.

Figure 2:
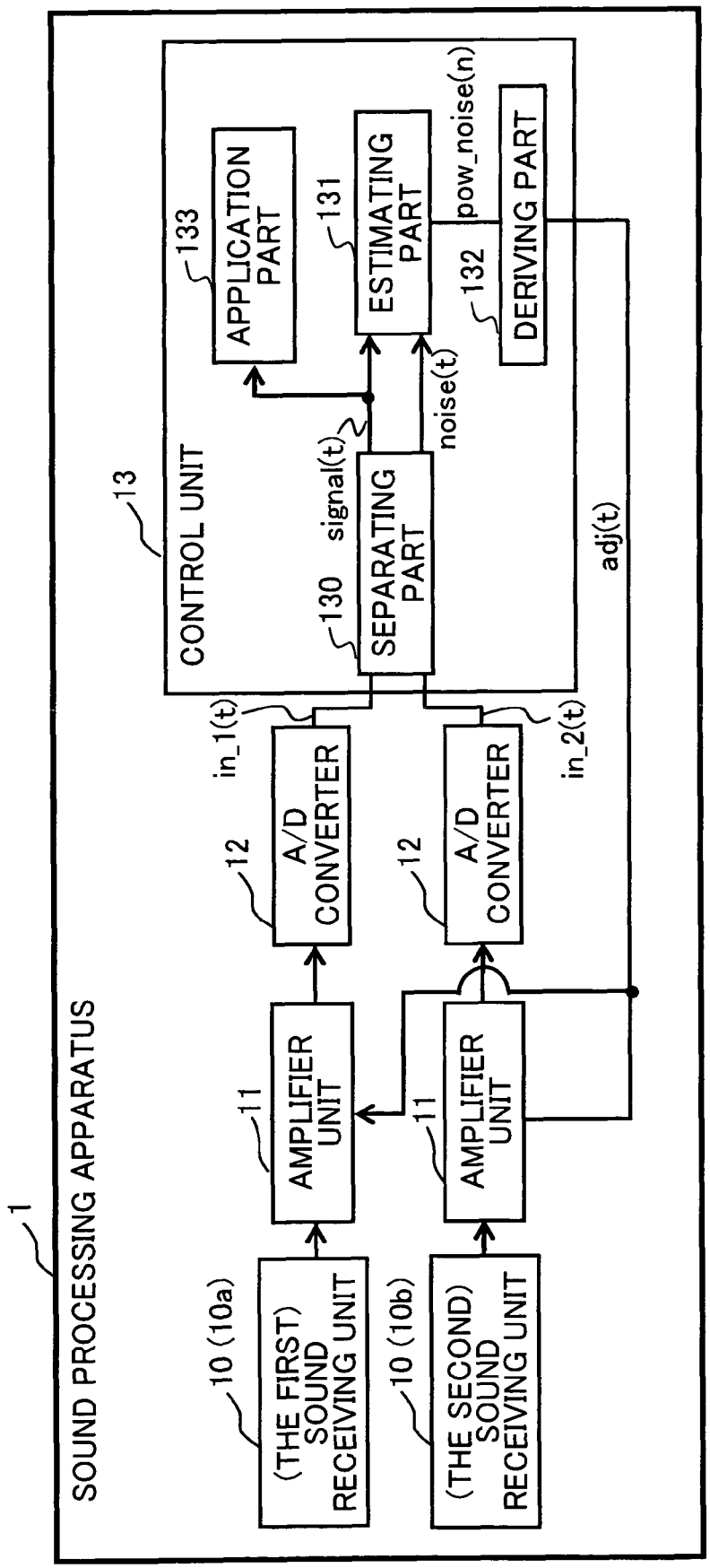
FIG. 2 is a functional block diagram of an exemplary feature of the sound processing apparatus according to the first exemplary embodiment of the present invention.

FIG. 2 is a functional block diagram of exemplary features of the sound processing apparatus 1 according to the first exemplary embodiment of the present invention. By executing the computer program 100, the control unit 13 generates the program modules functioning as: separating part 130 for separating a sound signal on the basis of the directions of arrival, estimating part 131 for estimating the power of background noise included in the sound signal on the basis of the separate sound signals, deriving part 132 for computing a gain control value to be output to the amplifier units 11 on the basis of the estimated power of the background noise and a predefined power target value, and application part 133 for performing a speech recognition process or a voice communication process on the basis of the speech signal that includes speech of the speaker and that are separated by the separating part 130. The functions of the program modules may be realized by hardware including an arithmetic circuit, such as a very-large-scale integrated circuit (VLSI).

Signal processing performed by the sound processing apparatus 1 according to the first exemplary embodiment of the present invention is described next. The control unit 13 receives a digital sound signal based on the sound received by the first sound receiving unit 10a as a first input signal $in\_1(t)$, and further receives a digital sound signal based on the sound received by the second sound receiving unit 10b as a second input signal $in\_2(t)$. A variable t represents a sample number for identifying each of samples obtained when the analog sound signal is sampled at a sampling frequency of, for example, 8000 Hz or 12000 Hz and is converted to a digital format.

Figure 3A:
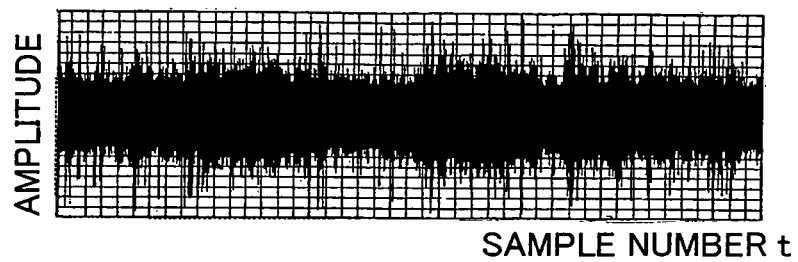
FIGS. 3A and 3B are graphs of sound signals received by a control unit of the sound processing apparatus according to the first exemplary embodiment of the present invention.
Figure 3B:

FIGS. 3A and 3B are graphs illustrating sound signals received by the control unit 13. In these graphs, the abscissa represents a sample number t corresponding to a sampling time, and the ordinate represents the amplitude of the sound signal. FIG. 3A is a graph for the first input signal $in\_1(t)$, and FIG. 3B is a graph for the second input signal $in\_2(t)$. By disposing the first sound receiving unit 10a and the second sound receiving unit 10b so as to have an appropriate spacing therebetween, a phase difference occurs between the sound signals based on the sounds received by the first sound receiving unit 10a and the second sound receiving unit 10b in accordance with the directions of arrival. The separating part 130 estimates the directions of arrival of the sounds on the basis of, for example, the phase difference between the first input signal $in\_1(t)$ and the second input signal $in\_2(t)$. The separating part 130 then performs a directional sound receiving process in which the sound signal is separated into a sound signal based on the sound arriving in a predetermined target direction, such as a direction towards the mouth of the speaker, and a sound signal based on sounds arriving from the other directions.

In the directional sound receiving process performed by the separating part 130, a speech signal signal(t) based on the sound signal of a sound arriving from the target direction (i.e., speech uttered by the speaker) is extracted by performing synchronous subtraction for suppressing a sound arriving from directions other than the target direction on the basis of the first input signal $in\_1(t)$ and the second input signal $in\_2(t)$. Subsequently, a sound signal based on a sound arriving from directions other than the target direction, that is, a noise signal noise(t) based on background noise is extracted by performing synchronous subtraction for suppressing the sound arriving from the target direction.

Figure 4A:
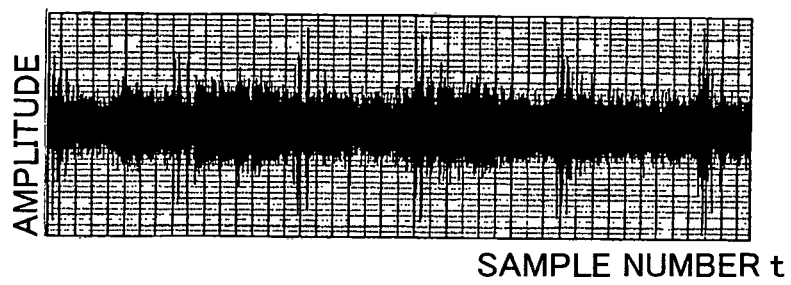
FIG. 4A illustrates a time variation in a speech signal separated through a directional sound receiving process of the sound processing apparatus according to the first exemplary embodiment of the present invention.
Figure 4B:
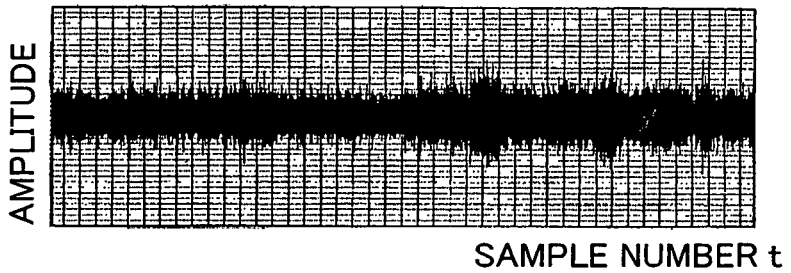
FIG. 4B illustrates a time variation in a noise signal.

FIGS. 4A and 4B are graphs illustrating time variations in the sound signals separated by the directional sound receiving process performed by the sound processing apparatus 1 according to the first exemplary embodiment of the present invention. In these graphs, the abscissa represents a sample number t corresponding to a time, and the ordinate represents the amplitude of the sound signal. FIG. 4A is a graph for the sound signal based on the sound arriving from the predefined target direction, that is, the speech signal signal(t), and FIG. 4B is a graph for the sound signal based on the sound arriving from directions other than the predefined target direction, that is, the noise signal noise(t). As can be seen from comparison between the speech signal signal(t) and the noise signal noise(t), peaks that are specific to a speech signal appear in the speech signal signal(t). The separating part 130 outputs the speech signal signal(t) to the application part 133, which performs a speech recognition process or a voice communication process on the basis of the speech signal signal(t). In addition, the separating part 130 outputs the speech signal signal(t) and the noise signal noise(t) to the estimating part 131.

The estimating part 131 generates, using the input speech signals signal(t) and noise signals noise(t), a speech signal signal(n) and a noise signal noise(n) on a frame-to-frame basis, where a frame includes signals of 512 samples for example. Here, the variable n is a frame number for identifying each frame. Subsequently, the estimating part 131 estimates the power of background noise pow_noise(n) using the following equation (1) used for computing the correlation between the frame-based speech signal signal(n) and the frame-based noise signal noise(n):

$$\mathrm{pow\_noise}(n) = 10\log_{10}\left(\frac{1}{N}\sum_{i=-(\frac{N}{2}-1)}^{N/2} \mathrm{signal}(512n+i)\mathrm{noise}(512n+i)\right) \quad (1)$$

where pow_noise(n) is the power of background noise, n is a frame number, signal(n) is a speech signal, and noise(n) is a noise signal.

Figure 5:
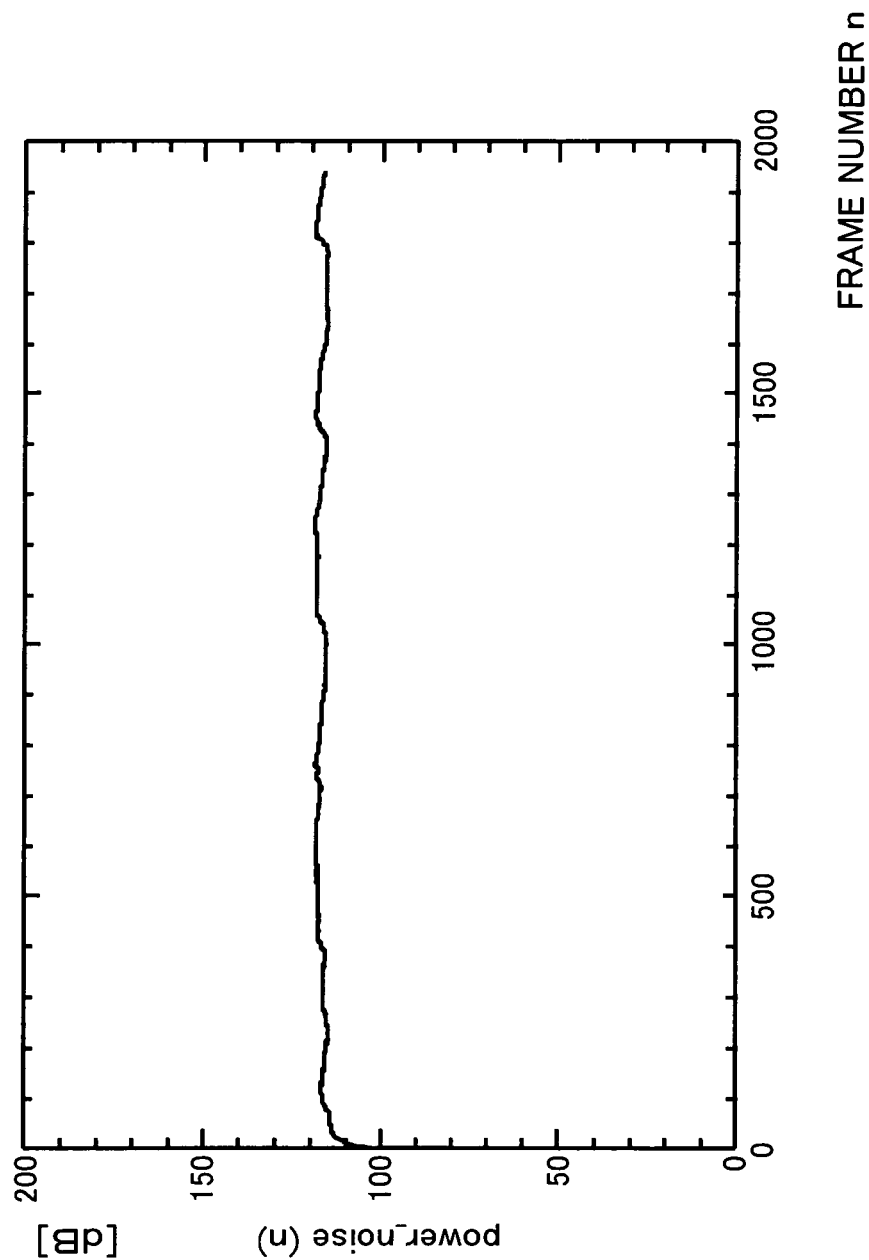
FIG. 5 is a graph illustrating a time variation in the power of background noise estimated by estimating part of the sound processing apparatus according to the first exemplary embodiment of the present invention.

FIG. 5 is a graph illustrating a time variation in the power of background noise pow_noise(n) estimated by the estimating part 131 of the sound processing apparatus 1. In the graph, the abscissa represents a frame number n corresponding to a time, and the ordinate represents the power of background noise pow_noise(n) on a decibel scale. By computing a correlation between the speech signal signal(n) and the noise signal noise(n) separated on the basis of the directions of arrival and by using a characteristic indicating that the correlation of a signal relating to background noise is higher than that of a signal relating to speech, the power of background noise pow_noise(n) can be estimated. In addition, by estimating the correlation in this manner, an effect of the voice and noise being erratic can be reduced. Subsequently, the estimating part 131 outputs information indicating the power of background noise pow_noise(n) to the deriving part 132.

The deriving part 132 computes an original gain control value adj'(n), which is a source of a gain control value adj(n) output to the amplifier units 11 and 11, using the power of background noise pow_noise(n) and a predetermined power target value ref and using the following equation (2):

$$\mathrm{adj}'(n) = \mathrm{ref} - \mathrm{pow\_noise}(n) \quad (2)$$

where adj'(n) is an original gain control value and ref is the power target value.

Figure 6:
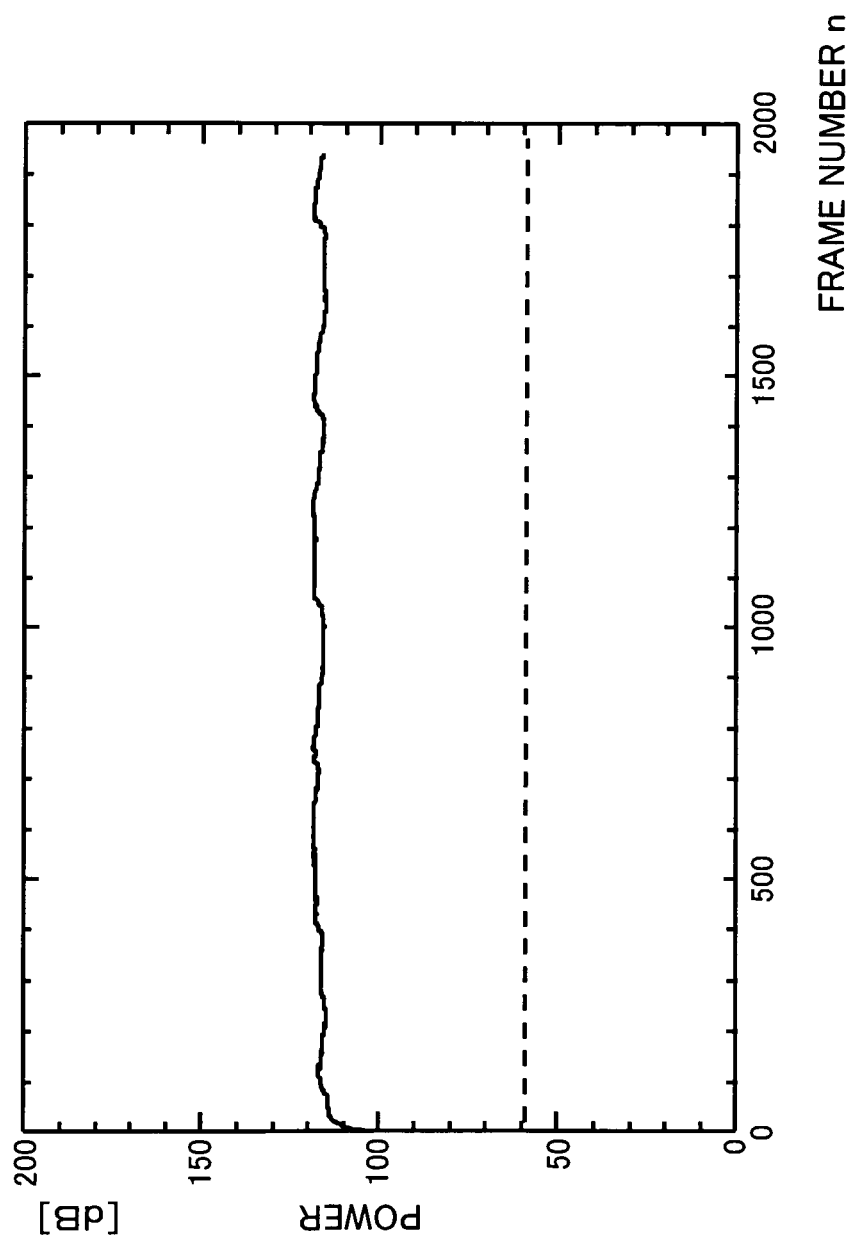
FIG. 6 is a graph illustrating time variations in the power of background noise and a power target value in the sound processing apparatus according to the first exemplary embodiment of the present invention.

FIG. 6 is a graph illustrating time variations in the power of background noise pow_noise(n) and the power target value ref in the sound processing apparatus 1. In the graph, the abscissa represents a frame number n corresponding to a time, and the ordinate represents the power of background noise pow_noise(n) and the power target value ref on a decibel scale. In FIG. 6, a solid line represents the power of background noise pow_noise(n), and a broken line represents the power target value ref. The original gain control value adj'(n) obtained using equation (2) is a difference between the power of background noise pow_noise(n) and the power target value ref. In the sound processing apparatus 1, the gain control value adj(t) of the amplifier units 11 and 11 is determined so that the power of background noise pow_noise(n) is equal to the power target value ref. In this way, the sensitivity of the sound receiving units 10 and 10 is adjusted.

In addition, the deriving part 132 computes the gain control value adj(t) output to the amplifier units 11 by smoothing the time variation in the original gain control value adj'(n) using the following equation:

$$\mathrm{adj}(t) = \alpha \cdot \mathrm{adj}(t-1) + (1-\alpha) \cdot \mathrm{adj}'(n) \quad (3)$$

where adj(t) is a gain control value and a is a time constant greater than or equal to 0 and less than 1.

Figure 7:
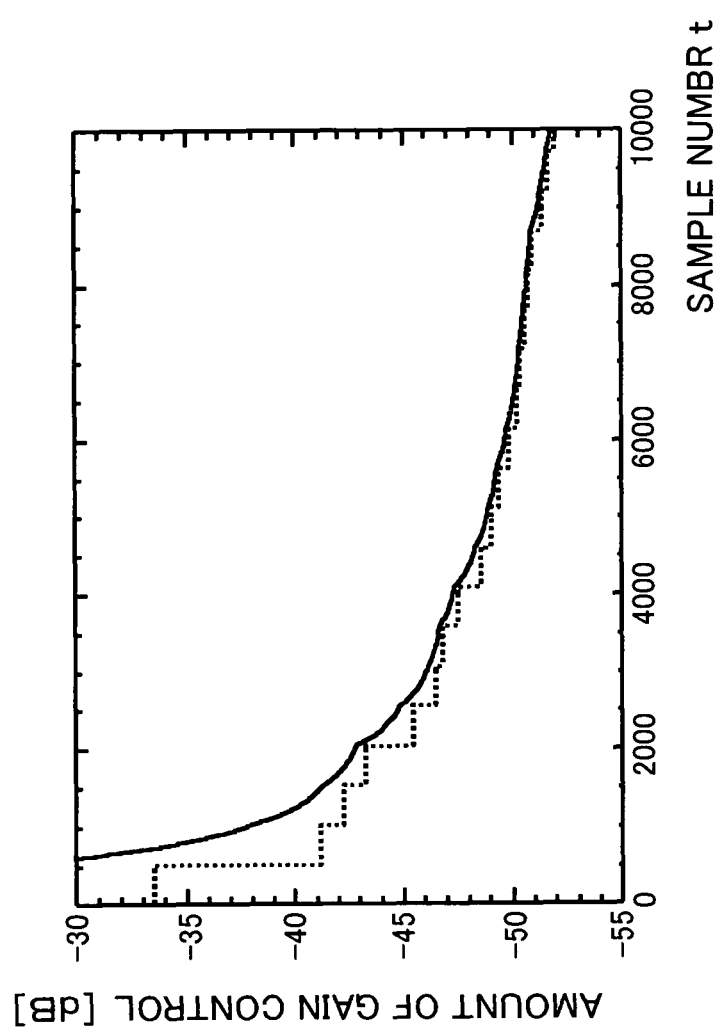
FIG. 7 is a graph illustrating time variations in an original gain control value and a gain control value in the sound processing apparatus according to the first exemplary embodiment of the present invention.

FIG. 7 is a graph illustrating time variation in the original gain control value adj'(n) and the gain control value adj(t) in the sound processing apparatus 1. In the graph, the abscissa represents a sample number t corresponding to a sampling time, and the ordinate represents an amount of gain control on a decibel scale. In FIG. 7, a broken line represents the original gain control value adj'(n) with a variable of the frame number n, and a solid line represents the gain control value adj(t) with a variable of the sample number t. Since the variable of the original gain control value adj'(n) is the frame number n, the frame number n is converted to the sample number t. Thereafter, the transition is shown. In an example shown in the present embodiment, since 512 samples correspond one frame, the values of the original gain control value adj'(n) form a graph with discrete values changing in a stepwise manner. However, since the time variation in the gain control value adj(t) that is smoothed using equation (3) is continuously changing with respect to the sample number t, the gain is not discretely or abruptly changed. Subsequently, the deriving part 132 outputs the computed gain control value adj(t) to the amplifier units 11 and 11, which set the input gain control value adj(t) as a gain.

Figure 8:
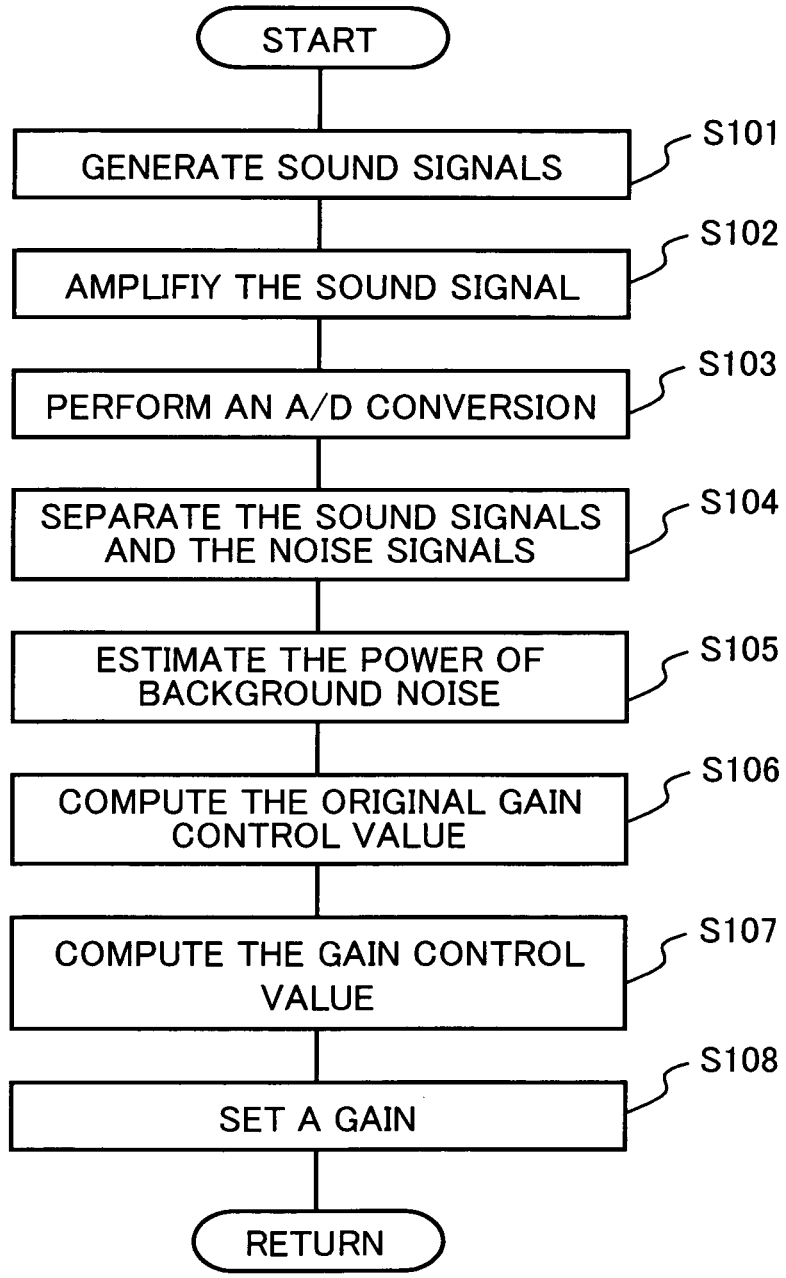
FIG. 8 is an operation chart of exemplary processing performed by the sound processing apparatus according to the first exemplary embodiment of the present invention.

Exemplary processing performed by the sound processing apparatus 1 is described next with reference to FIG. 8. The sound processing apparatus 1 generates sound signals on the basis of the sounds received by the first sound receiving unit 10a and the second sound receiving unit 10b (S101). The sound processing apparatus 1 then outputs each of the generated sound signals to a corresponding one of the amplifier units 11 and 11.

Each of the amplifier units 11 and 11 amplifies the sound signal generated by the corresponding one of the sound receiving units 10 and 10 on the basis of the set gain control value (S102), and outputs the amplified sound signal to the corresponding one of the A/D converters 12 and 12.

The A/D converters 12 and 12 perform an A/D conversion process for converting the analog sound signals to digital signals (S103). Thereafter, the A/D converters 12 and 12 output the first input signal in_1(t) and the second input signal in_2(t) to the control unit 13.

Through the process performed by the separating part 130, the control unit 13 estimates a direction of arrival on the basis of the first input signal in_1(t) and the second input signal in_2(t) and separates the sound signal based on sound arriving from the target direction, that is, the speech signal signal(t) based on the voice uttered from a speaker, from the sound signals based on the sound arriving from directions other than the target direction, that is, the noise signal noise(t) based on background noise (S104).

Through the process performed by the estimating part 131, the control unit 13 estimates the power of background noise pow_noise(n) on the basis of the correlation between the speech signal signal(t) and the noise signal noise(t) (S105).

Through the process performed by the deriving part 132, the control unit 13 computes the original gain control value adj'(n) on the basis of the power of background noise pow_noise(n) and the power target value ref (S106). By smoothing the time variation in the original gain control value adj'(n), the control unit 13 computes the gain control value adj(t) (S107). The control unit 13 then outputs the computed gain control value adj(t) to the amplifier units 11 and 11.

The amplifier units 11 and 11 set a gain on the basis of the input gain control value adj(t) (S108). The speech signal signal(t) separated in operation S104 is output to the application part 133. The application part 133 performs a speech recognition process or a voice communication process on the basis of the speech signal signal(t).

Second Exemplary Embodiment

A second exemplary embodiment determines whether computation of the gain control value is needed on the basis of a comparison result between the estimation result of the power of background noise and the power target value in the configuration of the first exemplary embodiment. Since exemplary hardware configuration and features of the second exemplary embodiment are the same as those of the first exemplary embodiment, the descriptions are not repeated. In the following description, similar numbering is used in describing a similar component as was utilized above in describing the first exemplary embodiment.

In the second exemplary embodiment, deriving part 132 compares the power of background noise pow_noise(n) with a predetermined power target value ref. Only when the size relationship satisfies a predetermined condition, does the deriving part 132 update the gain control value adj(t). More specifically, in the second exemplary embodiment, only when the power of background noise pow_noise(n) is greater than the power target value ref, the gain control value adj(t) is updated. In the second exemplary embodiment, the following conditional expression (4) is used in place of equation (2):

$$\begin{aligned}&\text{if }(\text{pow\_noise}(n) > \text{ref})\\&\quad\text{then adj'}(n) = \text{ref} - \text{pow\_noise}(n)\\&\quad\text{else adj'}(n) = 0\end{aligned} \quad \ldots (4)$$

As indicated by conditional expression (4), in the second exemplary embodiment, if the power of background noise pow_noise(n) is greater than the power target value ref, the original gain control value adj'(n) is computed using an equation similar to equation (2) described in the first exemplary embodiment. However, if the power of background noise pow_noise(n) is less than or equal to the power target value ref, the original gain control value adj'(n) is set to "0". In order to obtain the gain control value adj(t) from the original gain control value adj'(n), equation (3) described in the first exemplary embodiment is used. Accordingly, in the second exemplary embodiment, only if the power of background noise pow_noise(n) is greater than the power target value ref, the gain control value adj(t) is updated.

Figure 9:
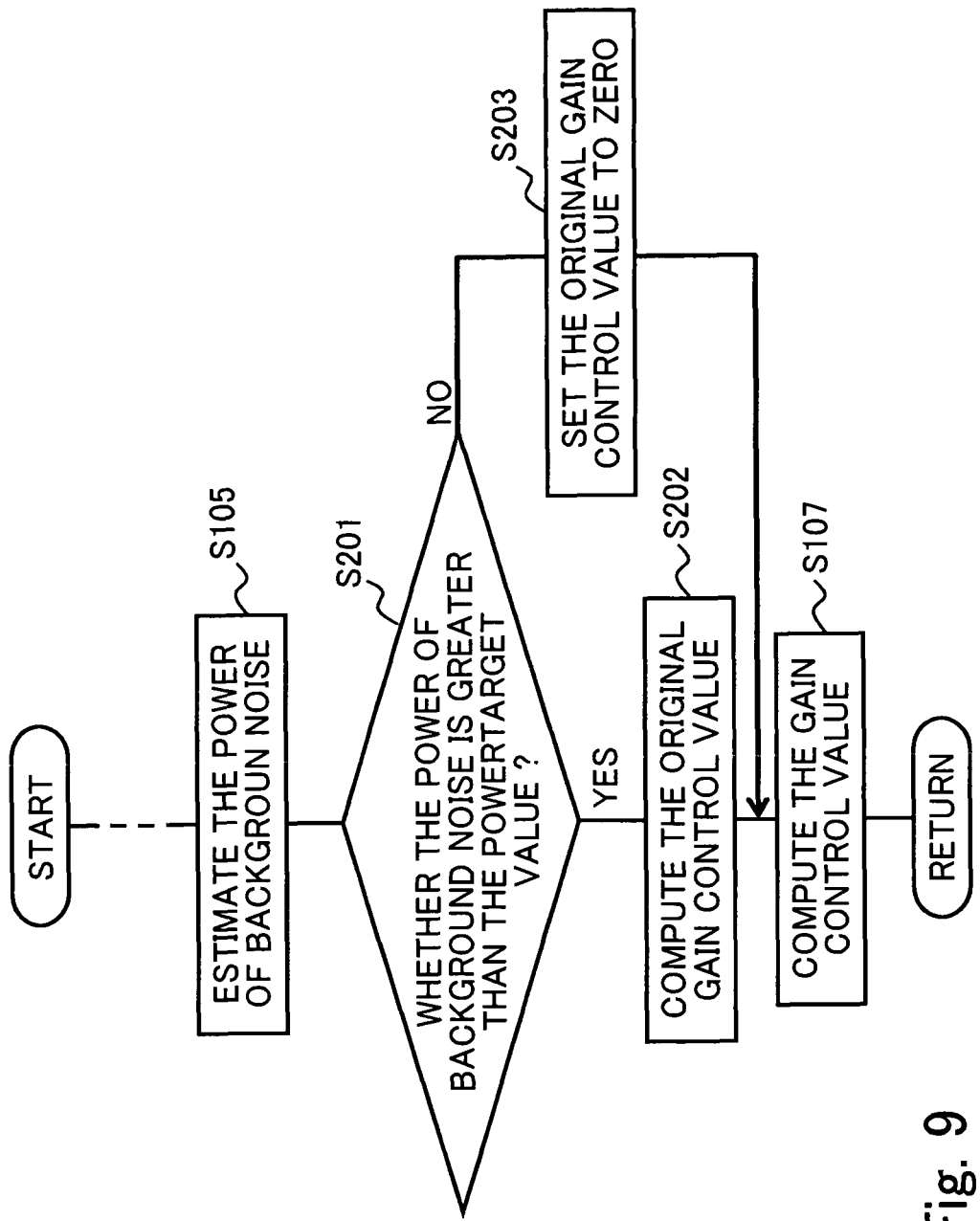
FIG. 9 is an operation chart of exemplary processing performed by a sound processing apparatus according to a second exemplary embodiment of the present invention.

Exemplary processing performed by the sound processing apparatus 1 according to the second exemplary embodiment of the present embodiment is next described with reference to FIG. 9. In the second exemplary embodiment, the process of operation S106 shown in the operation chart of FIG. 8 according to the first exemplary embodiment is replaced with a process based on the above-described conditional expression (4).

First, the sound processing apparatus 1 performs processes in operations S101 to S105 described in the first exemplary embodiment. Subsequently, the control unit 13 determines, through processing performed by the deriving part 132, whether the power of background noise pow_noise(n) is greater than the power target value ref (S201).

If, in operation S201, the power of background noise pow_noise(n) is greater than the power target value ref ("YES" in operation S201), the control unit 13 computes, through processing performed by the deriving part 132, the original gain control value adj'(n) on the basis of the power of background noise pow_noise(n) and the power target value ref (S202).

If, in operation S202, the power of background noise pow_noise(n) is less than or equal to the power target value ref ("NO" in operation S201), the control unit 13 sets, through processing performed by the deriving part 132, the original gain control value adj'(n) to "0" (S203).

Subsequently, the sound processing apparatus 1 performs the processes subsequent to operation S107 described in the first exemplary embodiment. In this method, only when the power of background noise pow_noise(n) is greater than the power target value ref, the gain control value adj(t) is updated. Accordingly, for example, this method can be applied to the case where a speech switch of a car navigation system is pressed in order to stop noise caused by a car audio unit and, subsequently, a user start speaking. In this way, saturation of a sound signal can be prevented, since an excessive increase in the sensitivity of the sound receiving units 10 and 10 due to an increase in the gain does not occur.

In the case where, only when the power of background noise pow_noise(n) is less than the power target value ref, the gain control value adj(t) is updated, conditional expression (4) is changed to the following conditional expression (5):

$$\begin{aligned}&\text{if }(\text{pow\_noise}(n) < \text{ref})\\&\quad\text{then adj'}(n) = \text{ref} - \text{pow\_noise}(n)\\&\quad\text{else adj'}(n) = 0\end{aligned} \quad \ldots (5)$$

In this method, by using conditional expression (5), only when the power of background noise pow_noise(n) is less than the power target value ref, the gain control value adj(t) is updated. Accordingly, for example, this method can be applied to the case where a noise level frequently changes. Thus, saturation of a sound signal can be prevented, since an excessive decrease in an audio level due to a decrease in the gain does not occur.

Third Exemplary Embodiment

In a third exemplary embodiment, a time constant is determined in accordance with a size relationship between the obtained original gain control value and the previous gain control value in the configuration of the first exemplary embodiment. Since exemplary hardware configuration and features of the third exemplary embodiment are the same as those of the first exemplary embodiment, the descriptions are not repeated. In the following description, similar numbering is used in describing a similar component as was utilized above in describing the first exemplary embodiment.

In the third exemplary embodiment, the deriving part 132 compares the obtained original gain control value adj'(n) and the previous gain control value adj(t−1). If the obtained original gain control value adj'(n) is less than the previous gain control value adj(t−1), a first time constant $\alpha 1$ ($0 \leq \alpha 1 < 1$) is used. However, if the obtained original gain control value adj'(n) is greater than or equal to the previous gain control value adj(t−1), a second time constant $\alpha 2$ ($0 \leq \alpha 2 < 1$) is used. In the third exemplary embodiment, the following conditional expression (6) is used in place of equation (3):

$$\begin{aligned}&\text{if } (\text{adj}(t-1) < \text{adj'}(n)) \\ &\quad \text{then adj}(t) = \alpha 1 \cdot \text{adj}(t-1) + (1-\alpha 1) \cdot \text{adj'}(n) \\ &\quad \text{else adj}(t) = \alpha 2 \cdot \text{adj}(t-1) + (1-\alpha 2) \cdot \text{adj'}(n)\end{aligned} \quad \ldots (6)$$

where $\alpha 1$ is a first time constant greater than or equal to 0 and less than 1, and $\alpha 2$ is a second time constant greater than or equal to 0 and less than 1.

As indicated by conditional expression (6), when the gain control value adj(t) is decreased over time, the follow-up performance of the gain control value adj(t) following the original gain control value adj'(n) before smoothing can be relatively increased by determining the time constant value on the basis of the original gain control value adj'(n) and the previous gain control value adj(t−1) and, in particular, by setting the second time constant $\alpha 2$ to a value greater than the first time constant $\alpha 1$. In the case that the second time constant $\alpha 2$ is set to a value smaller than the first time constant $\alpha 1$, when the gain control value adj(t) is decreased over time, the follow-up performance of the gain control value adj(t) following the original gain control value adj'(n) before smoothing can be relatively increased.

Figure 10:
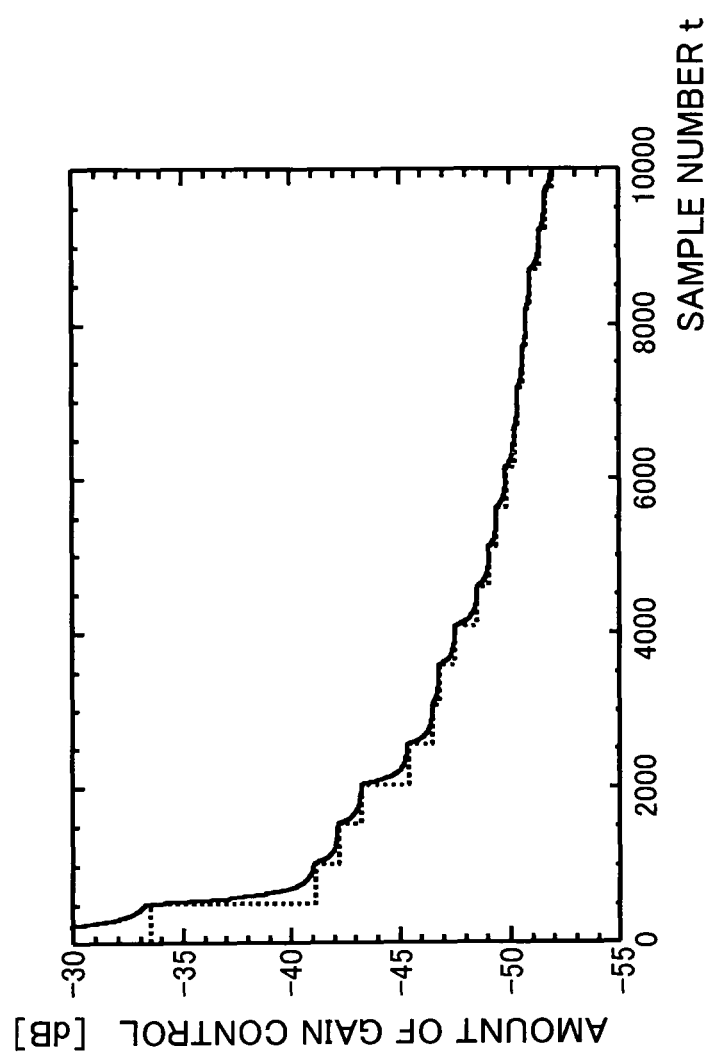
FIG. 10 is a graph illustrating time variations in a original gain control value and a gain control value in a sound processing apparatus according to a third exemplary embodiment of the present invention.

FIG. 10 is a graph illustrating time variations in the original gain control value adj'(n) and the gain control value adj(t) in the sound processing apparatus 1 according to the third exemplary embodiment of the present invention. In the graph, the abscissa represents a sample number t corresponding to (a sampling time, and the ordinate represents an amount of gain control on a decibel scale. In FIG. 10, a broken line represents the original gain control value adj'(n) with a variable of the frame number n, and a solid line represents the gain control value adj(t) with a variable of the sample number t. Since the variable of the original gain control value adj'(n) is the frame number n, the frame number n is converted to the sample number t. Thereafter, the transition is shown. In FIG. 10, the value of the first time constant $\alpha 1$ is the same as the value of the time constant $\alpha$ of the first exemplary embodiment, and the value of the second time constant $\alpha 2$ is greater than the value of the first time constant $\alpha 1$. As can be seen from a comparison with FIG. 7 of the first exemplary embodiment, when the gain control value adj(t) is decreased over time, the second time constant $\alpha 2$ greater than the time constant $\alpha$ of the first exemplary embodiment is used. In this way, the follow-up performance of the gain control value adj(t) following the original gain control value adj'(n) before smoothing can be increased.

Figure 11:
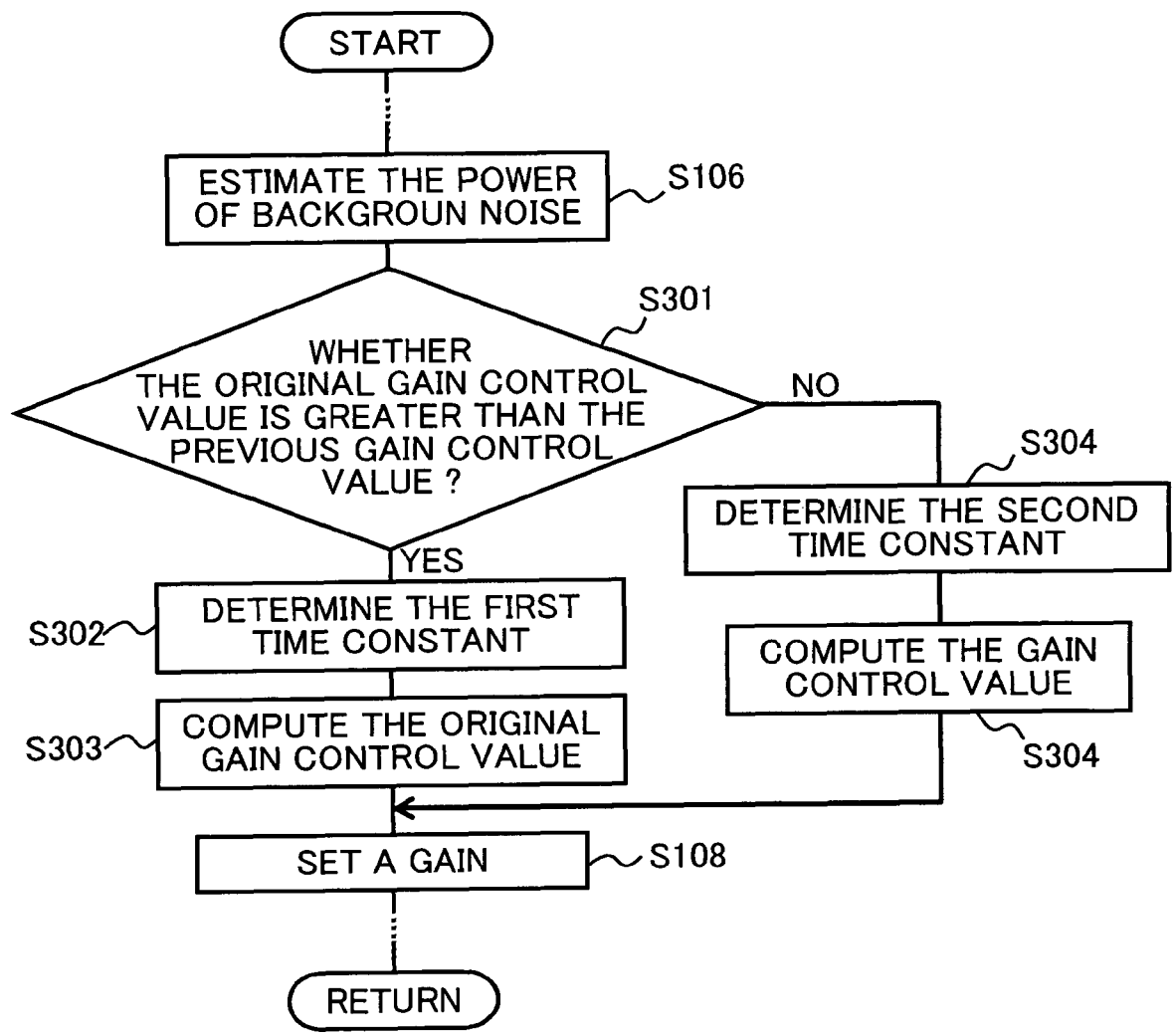
FIG. 11 is an operation chart of exemplary processing performed by the sound processing apparatus according to the third exemplary embodiment of the present invention.

Exemplary processing performed by the sound processing apparatus 1 according to the third exemplary embodiment of the present invention is described next. FIG. 11 is an operation chart of exemplary processing performed by the sound processing apparatus 1 according to the third exemplary embodiment of the present invention. In the third exemplary embodiment, the process performed in operation S107 of the operation chart described in the first exemplary embodiment is replaced with the process based on the above-described conditional expression (6).

First, the sound processing apparatus 1 performs the processes in operations S101 to S106 described in the first exemplary embodiment. Subsequently, through a process performed by the deriving part 132, the control unit 13 of the sound processing apparatus 1 compares the original gain control value adj'(n) with the previous gain control value adj(t−1) so as to determine whether the original gain control value adj'(n) is greater than the previous gain control value adj(t−1) (S301).

If, in operation S301, the original gain control value adj'(n) is greater than the previous gain control value adj(t−1) ("YES" in operation S301), the control unit 13 of the sound processing apparatus 1 determines, through a process performed by the deriving part 132, a time constant used for smoothing to be the first time constant $\alpha 1$ (S302). By smoothing the time variation of the original gain control value adj'(n) using the determined first time constant $\alpha 1$, the control unit 13 computes the gain control value adj(t) (S303).

However, if, in operation S301, the original gain control value adj'(n) is less than or equal to the previous gain control value adj(t−1) ("NO" in operation S301), the control unit 13 of the sound processing apparatus 1 determines, through a process performed by the deriving part 132, a time constant used for smoothing to be the second time constant $\alpha 2$ that is greater than the first time constant $\alpha 1$ (S304). By smoothing the time variation of the original gain control value adj'(n) using the determined second time constant $\alpha 2$, the control unit 13 computes the gain control value adj(t) (S305).

Thereafter, the sound processing apparatus 1 performs the processes subsequent to operation S108 described in the first exemplary embodiment.

Fourth Exemplary Embodiment

In a fourth exemplary embodiment, the control method of the amplifier unit in the first exemplary embodiment is changed. Since an exemplary hardware configuration of the fourth exemplary embodiment is the same as that of the first exemplary embodiment, the description is not repeated. In the following description, similar numbering is used in describing a similar component as was utilized above in describing the first exemplary embodiment.

Figure 12:
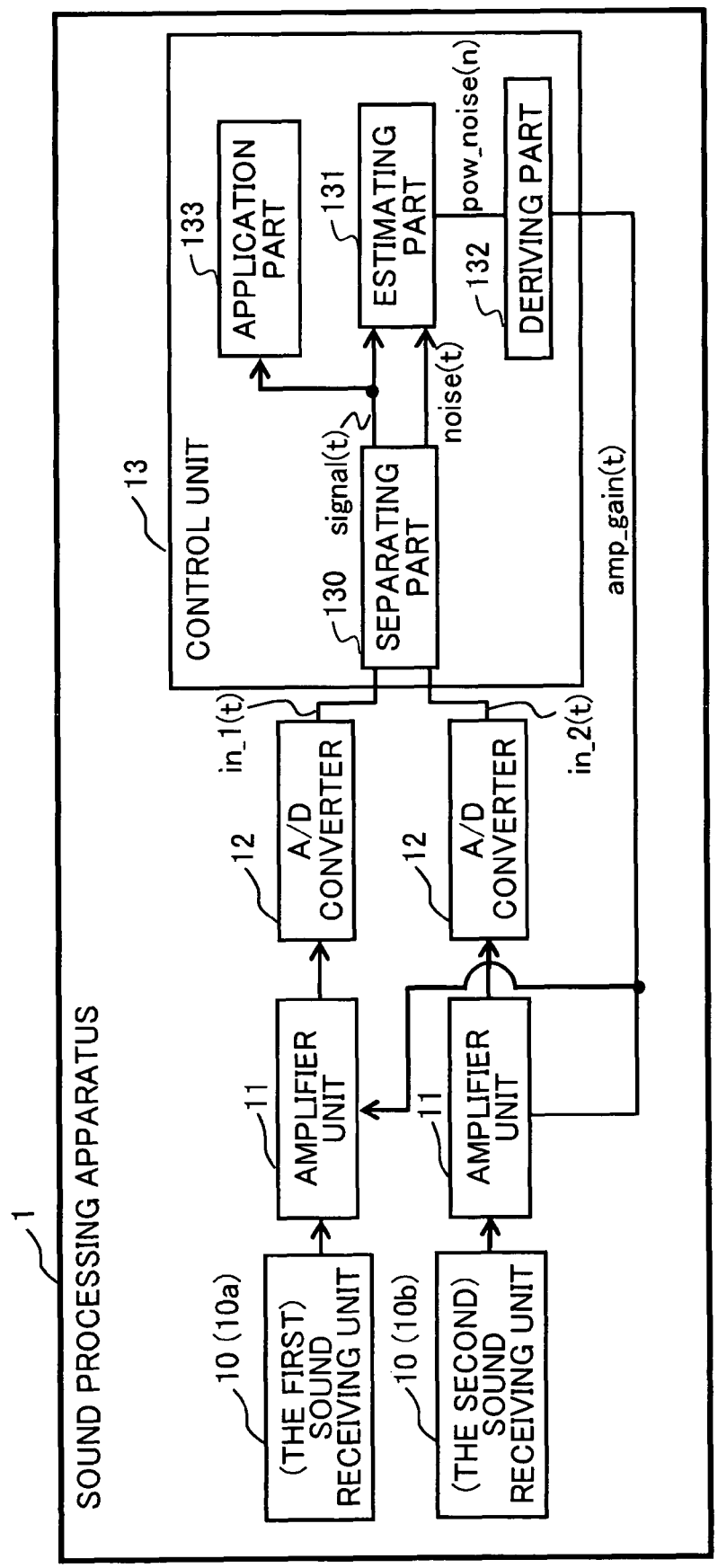
FIG. 12 is a functional block diagram of an exemplary feature of a sound processing apparatus according to a fourth exemplary embodiment of the present invention.

FIG. 12 is a functional block diagram of an exemplary feature of the sound processing apparatus 1 according to the fourth exemplary embodiment of the present invention. By executing the computer program 100 according to the embodiment, the control unit 13 generates program modules functioning as: separating part 130, estimating part 131, deriving part 132, and application part 133.

Signal processing performed by the sound processing apparatus 1 according to the fourth exemplary embodiment is described next. In the first exemplary embodiment, the gain control value adj(t) output from the control unit 13 to the amplifier units 11 and 11 is a correction value of the gain, which is a difference with respect to the gain before correction is performed. If the amplifier units 11 and 11 have a function of automatically correcting the gain on the basis of the difference, gain control can be performed on the basis of the input gain control value adj(t) without any problems. However, if the amplifier units 11 and 11 do not have such a function and directly use the input gain control value adj(t) for a gain, the gain control value adj(t) needs to be converted so as to become a gain itself. In the fourth exemplary embodiment, a gain control value amp_gain(t) that is an absolute value is computed from the gain control value adj(t) that is a relative value. In addition, control using the computed gain control value amp_gain(t) is performed so that the gain control range of each of the amplifier units 11 and 11 stays within a given control range determined by a maximum value and a minimum value.

In the fourth exemplary embodiment, the deriving part 132 computes an accumulation value total_adj(t) from the gain control value adj(t) that is a value relative to the previous gain control value adj(t−1) using the following equation:

$$\text{total\_adj}(t) = \text{total\_adj}(t-1) + \text{adj}(t) \quad (7)$$

where total_adj(t) is the accumulation value of adj(t).

Furthermore, the deriving part 132 adjusts the accumulation value so that the gain control range stays within a given control range between a maximum value max_amp_gain and a minimum value min_amp_gain determined by the specification of the amplifier units 11, using the following conditional expression:

$$\begin{aligned}&\text{if } ((\text{total\_adj}(t) + \text{init\_amp\_gain}) > \text{max\_amp\_gain}) \\ &\quad \text{then total\_adj}(t) = \text{max\_amp\_gain} - \text{init\_amp\_gain} \\ &\text{if } ((\text{total\_adj}(t) + \text{init\_amp\_gain}) < \text{min\_amp\_gain}) \\ &\quad \text{then total\_adj}(t) = \text{min\_amp\_gain} - \text{init\_amp\_gain}\end{aligned} \quad \ldots (8)$$

where max_amp_gain is a maximum value of the gain of the amplifier units 11 and 11, min_amp_gain is a minimum value of the gain of the amplifier units 11 and 11, and init_amp_gain is an initial value of the gain of the amplifier units 11 and 11.

Still furthermore, the deriving part 132 computes a gain control value amp_gain(t) that is an absolute control value of the amplifier units 11 and 11 using the following equation:

$$\text{amp\_gain}(t) = \text{total\_adj}(t) + \text{init\_amp\_gain} \quad (9)$$

where amp_gain(t) is a gain control value.

Figure 13:
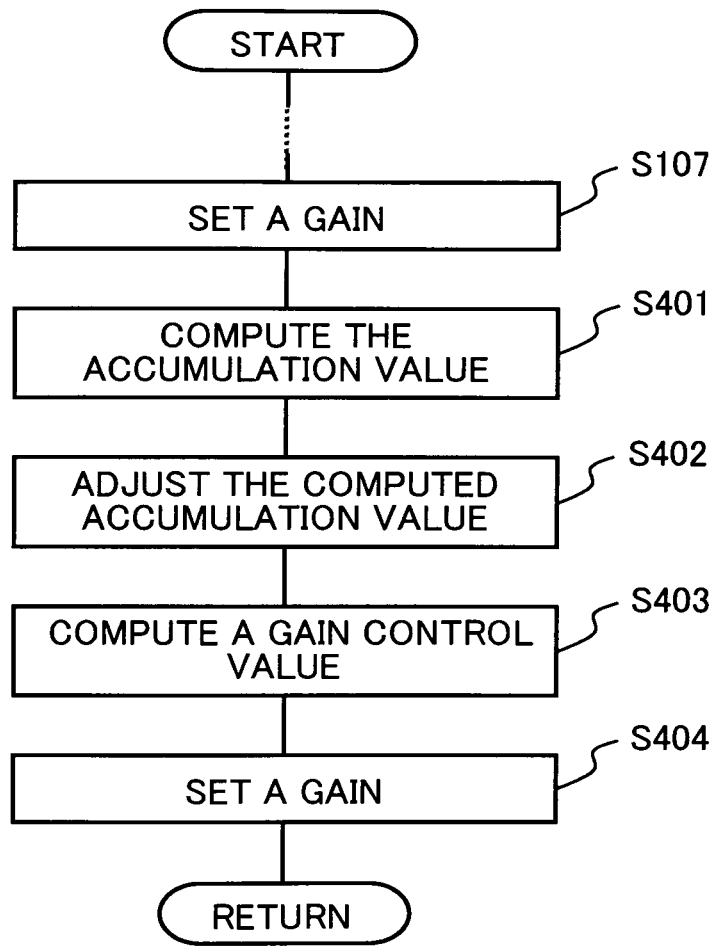
FIG. 13 is an operation chart of exemplary processing performed by the sound processing apparatus according to the fourth exemplary embodiment of the present invention.

Exemplary processing performed by the sound processing apparatus 1 according to the fourth exemplary embodiment of the present invention is described next. FIG. 13 is an operation chart of exemplary processing performed by the sound processing apparatus 1 according to the fourth exemplary embodiment of the present invention. In the fourth exemplary embodiment, after the process performed in operation S107 of the operation chart described in the first exemplary embodiment is completed, processes based on the above-described expressions (7) to (9) are performed.

First, the sound processing apparatus 1 performs the processes in operations S101 to S107 described in the first exemplary embodiment. Subsequently, through a process performed by the deriving part 132, the control unit 13 of the sound processing apparatus 1 computes the accumulation value total_adj(t) from the obtained gain control value adj(t) and the previous gain control value adj(t−1) (S401). Subsequently, the control unit 13 adjusts the computed accumulation value total_adj(t) so that the accumulation value total_adj(t) falls within a control range between the maximum value max_amp_gain and the minimum value min_amp_gain determined by the specification of the amplifier units 11 (S402).

Thereafter, the control unit 13 of the sound processing apparatus 1 computes, through a process performed by the deriving part 132, the absolute value of a gain control value amp_gain(t) used for control of the amplifier units 11 and 11 from the adjusted accumulation value total_adj(t) and the initial value init_amp_gain of the gain of the amplifier units 11 and 11 (S403). The control unit 13 then outputs the obtained gain control value amp_gain(t) to the amplifier units 11 and 11.

The amplifier units 11 and 11 of the sound processing apparatus 1 set the input gain control value amp_gain(t) as the gain (S404). The method for adjusting the accumulation value total_adj(t) so that the accumulation value total_adj(t) falls within a given control range between the maximum value max_amp_gain and the minimum value min_amp_gain is not limited thereto. For example, one of a variety of other methods can be employed.

Fifth Exemplary Embodiment

While the gain of the amplifier units is controlled in the first exemplary embodiment, a plurality of sets of amplifier units having different gains are used in a fifth exemplary embodiment. In the following description, similar numbering is used in describing a similar component as was utilized above in describing the first exemplary embodiment, and descriptions thereof are not repeated.

Figure 14:
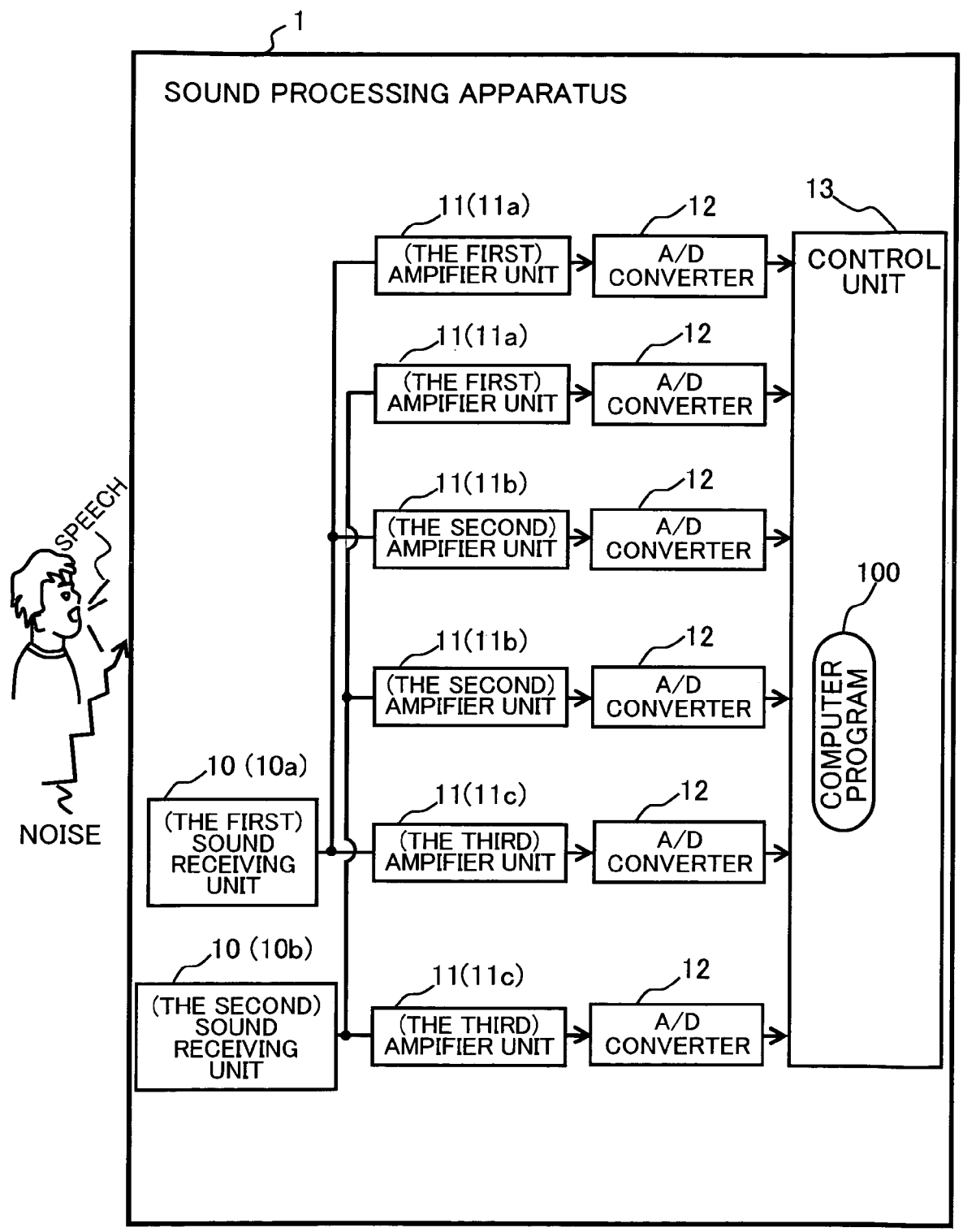
FIG. 14 is a block diagram of an exemplary hardware configuration of a sound processing apparatus according to a fifth exemplary embodiment of the present invention.

FIG. 14 is a block diagram of an exemplary hardware configuration of the sound processing apparatus 1 according to the fifth exemplary embodiment of the present invention. According to the fifth exemplary embodiment, the sound processing apparatus 1 includes a plurality of sets of amplifier units 11, 11, . . . each set amplifying sound signals with a fixed gain. The gains of the sets are different. The following description is made under the assumption that three sets of amplifier units 11, 11, and 11 are used. The amplifier units 11 and 11 of the set having the highest gain are denoted as first amplifier units 11a and 11a as needed. The amplifier units 11 and 11 of the set having the second highest gain are denoted as second amplifier units 11b and 11b. The amplifier units 11 and 11 of the set having the lowest gain are denoted as third amplifier units 11c and 11c. In addition, each of the A/D converters 12, 12, . . . is connected to a corresponding one of the amplifier units 11. Each of the sound signals converted to a digital signal by the corresponding one of the A/D converters 12, 12, . . . is output to the control unit 13.

Figure 15:
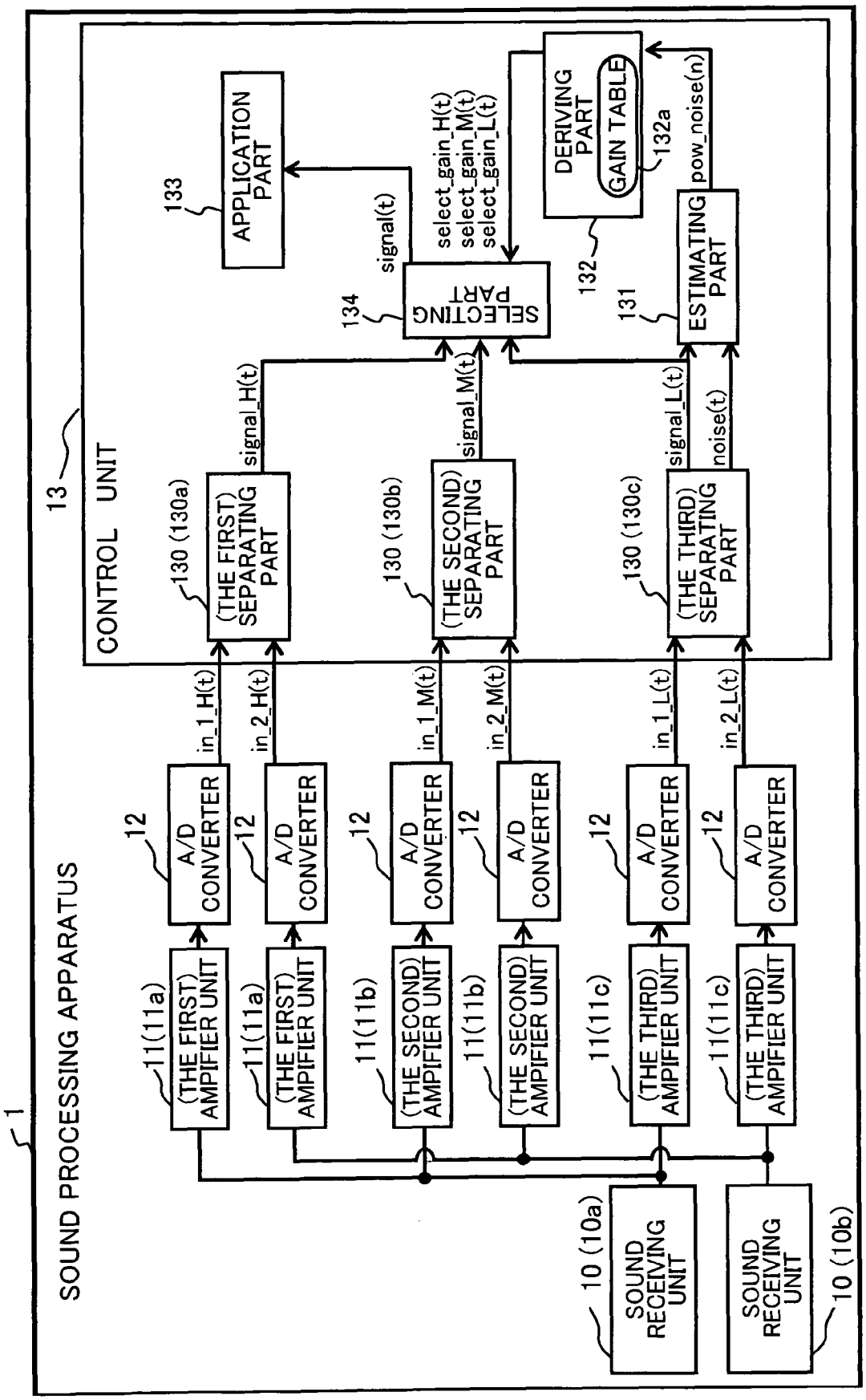
FIG. 15 is a functional block diagram of an exemplary feature of the sound processing apparatus according to the fifth exemplary embodiment of the present invention.

FIG. 15 is a functional block diagram of an exemplary feature of the sound processing apparatus 1 according to the fifth exemplary embodiment of the present invention. By executing the computer program 100 according to the embodiment of the present invention, the control unit 13 generates program modules functioning as: a plurality of separating part 130, 130, and 130, estimating part 131, deriving part 132 for computing a target value of the gain, and application part 133, and selecting part 134 for selecting a sound signal on the basis of the target value of the gain and the gain of each of the amplifier units 11, 11, and 11. The deriving part 132 includes a gain table 132a indicating a relationship between the target value of the gain and a coefficient required for selection of a sound signal.

The plurality of separating part 130, 130, and 130 correspond to the first amplifier units 11a and 11a, the second amplifier units 11b and 11b, and the third amplifier units 11c and 11c, respectively. Hereinafter, the separating part 130 corresponding to the first amplifier units 11a and 11a is denoted as first separating part 130a as needed. The separating part 130 corresponding to the second amplifier units 11b and 11b is denoted as second separating part 130b. Similarly, the separating part 130 corresponding to the third amplifier units 11c and 11c is denoted as third separating part 130c.

Exemplary processing performed by the sound processing apparatus 1 according to the fifth exemplary embodiment of the present invention is described next. In the control unit 13, the first sound receiving unit 10a receives a sound, and the first amplifier unit 11a amplifies a sound signal. The amplified sound signal is converted to a digital sound signal. The first separating part 130a receives the digital sound signal as a first high-gain input signal in_1_H(t). In addition, the second sound receiving unit 10b receives the sound, and the first amplifier unit 11a amplifies a sound signal. The amplified sound signal is converted to a digital sound signal. The first separating part 130a receives the digital sound signal as a second high-gain input signal in_2_H(t). Furthermore, in the control unit 13, the second amplifier unit 11b amplifies a sound signal based on the sound received by the first sound receiving unit 10a. The amplified sound signal is converted to a digital sound signal. The second separating part 130b receives the digital sound signal as a first middle-gain input signal in_1_M(t). In addition, the second amplifier unit 11b amplifies a sound signal based on the sound received by the second sound receiving unit 10b. The amplified sound signal is converted to a digital sound signal. The second separating part 130b receives the digital sound signal as a second middle-gain input signal in_2_M(t). Still furthermore, in the control unit 13, the third amplifier unit 11c amplifies a sound signal based on the sound received by the first sound receiving unit 10a. The amplified sound signal is converted to a digital sound signal. The third separating part 130c receives the digital sound signal as a first low-gain input signal in_1_L(t). In addition, the third amplifier units 11c and 11c amplify a sound signal based on the sound received by the second sound receiving unit 10b. The amplified sound signal is converted to a digital sound signal. The third separating part 130c receives the digital sound signal as a second low-gain input signal in_2_L(t).

In the directional sound receiving process performed by the first separating part 130a, a high-gain speech signal signal_H(t) based on a sound arriving from a target direction, that is, based on speech uttered by a speaker, is extracted on the basis of the first high-gain input signal in_1_H(t) and the second high-gain input signal in_2_H(t). In the directional sound receiving process performed by the second separating part 130b, a middle-gain speech signal signal_M(t) based on the speech arriving from the target direction is extracted on the basis of the first middle-gain input signal in_1_M(t) and the second middle-gain input signal in_2_M(t). Furthermore, in the directional sound receiving process performed by the third separating part 130c, a low-gain speech signal signal_L(t) based on the speech arriving from the target direction is extracted on the basis of the first low-gain input signal in_1_L(t) and the second low-gain input signal in_2_L(t). In addition, a noise signal noise(t) based on sounds arriving from directions other than the target direction, that is, based on the background noise, is extracted.

The first separating part 130a, the second separating part 130b, and the third separating part 130c output the high-gain speech signal signal_H(t), the middle-gain speech signal signal_M(t), and the low-gain speech signal signal_L(t) to the selecting part 134, respectively. In addition, the third separating part 130c outputs the low-gain speech signal signal_L(t) and the noise signal noise(t) to the estimating part 131.

The estimating part 131 outputs, to the deriving part 132, information indicating the power of background noise pow_noise(n) estimated on the basis of the input low-gain speech signal signal_L(t) and noise signal noise(t).

The deriving part 132 computes a gain control value amp_gain(t) on the basis of the power of background noise pow_noise(n) and a predetermined power target value ref. The gain control value amp_gain(t) can be computed using the method for obtaining a gain control value amp_gain(t) described in the fourth exemplary embodiment.

In addition, the deriving part 132 computes a high-gain coefficient select_gain_H(t) for the high-gain speech signal signal_H(t), a middle-gain coefficient select_gain_M(t) for the middle-gain speech signal signal_M(t), and a low-gain coefficient select_gain_L(t) for the low-gain speech signal signal_L(t) on the basis of the gain control value amp_gain(t) and the gain table 132a.

Figure 16:
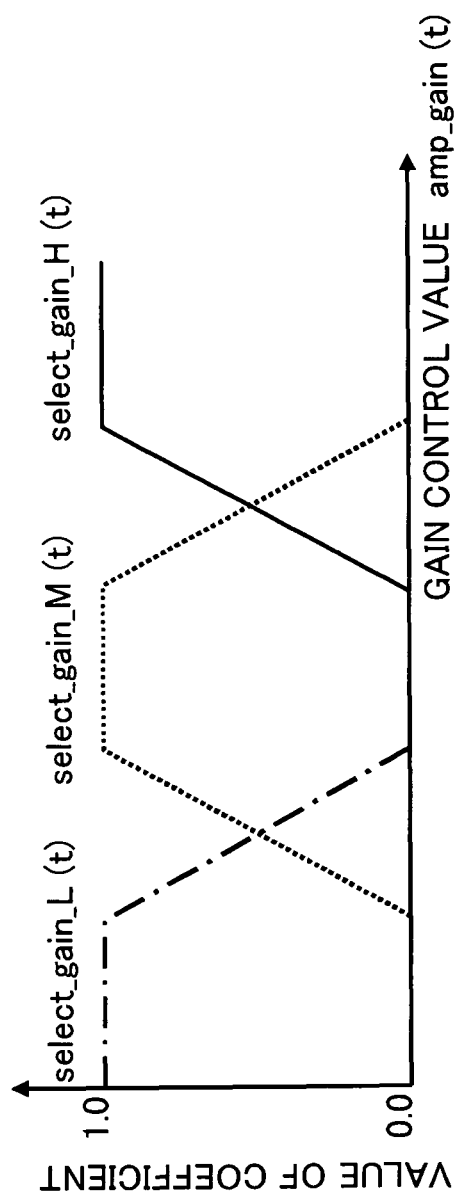
FIG. 16 is a graph illustrating the details of a gain table used in the sound processing apparatus according to the fifth exemplary embodiment of the present invention.

FIG. 16 is a graph illustrating the details of the gain table 132a used in the sound processing apparatus 1 according to the fifth exemplary embodiment of the present invention. In FIG. 16, the abscissa represents a gain control value amp_gain(t), and the ordinate represents the value of the coefficient. In FIG. 16, a solid line represents the high-gain coefficient select_gain_H, a broken line represents the middle-gain coefficient select_gain_M(t), and an alternate long and short dash line represents the low-gain coefficient select_gain_L(t). By using the gain table 132a graphically illustrated in FIG. 16, the high-gain coefficient select_gain_H(t), the middle-gain coefficient select_gain_M(t), and the low-gain coefficient select_gain_L(t) can be computed. As shown in FIG. 16, each of the high-gain coefficient select_gain_H(t), the middle-gain coefficient select_gain_M(t), and the low-gain coefficient select_gain_L(t) is in the range from 0 to 1. The sum of these values is always 1. Subsequently, the deriving part 132 outputs the computed high-gain coefficient select_gain_H(t), middle-gain coefficient select_gain_M(t), and low-gain coefficient select_gain_L(t) to the selecting part 134.

The selecting part 134 generates a speech signal signal(t), which is output to the application part 133, from the high-gain speech signal signal_H(t), the middle-gain speech signal signal_M(t), the low-gain speech signal signal_L(t), the high-gain coefficient select_gain_H(t), the middle-gain coefficient select_gain_M(t), and the low-gain coefficient select_gain_L(t) using the following equation:

$$\text{signal}(t) = \text{select\_gain\_}H(t)\cdot\text{signal\_}H(t) + \text{select\_gain\_}M(t)\cdot\text{signal\_}M(t) + \text{select\_gain\_}L(t)\cdot\text{signal\_}L(t) \tag{10}$$

where signal(t) is a speech signal, select_gain_H(t) is a high-gain coefficient, signal_H(t) is a high-gain speech signal, select_gain_M(t) is a middle-gain coefficient, signal_M(t) is a middle-gain speech signal, select_gain_L(t)=a low-gain coefficient, and signal_L(t)=a low-gain speech signal.

Figure 17:
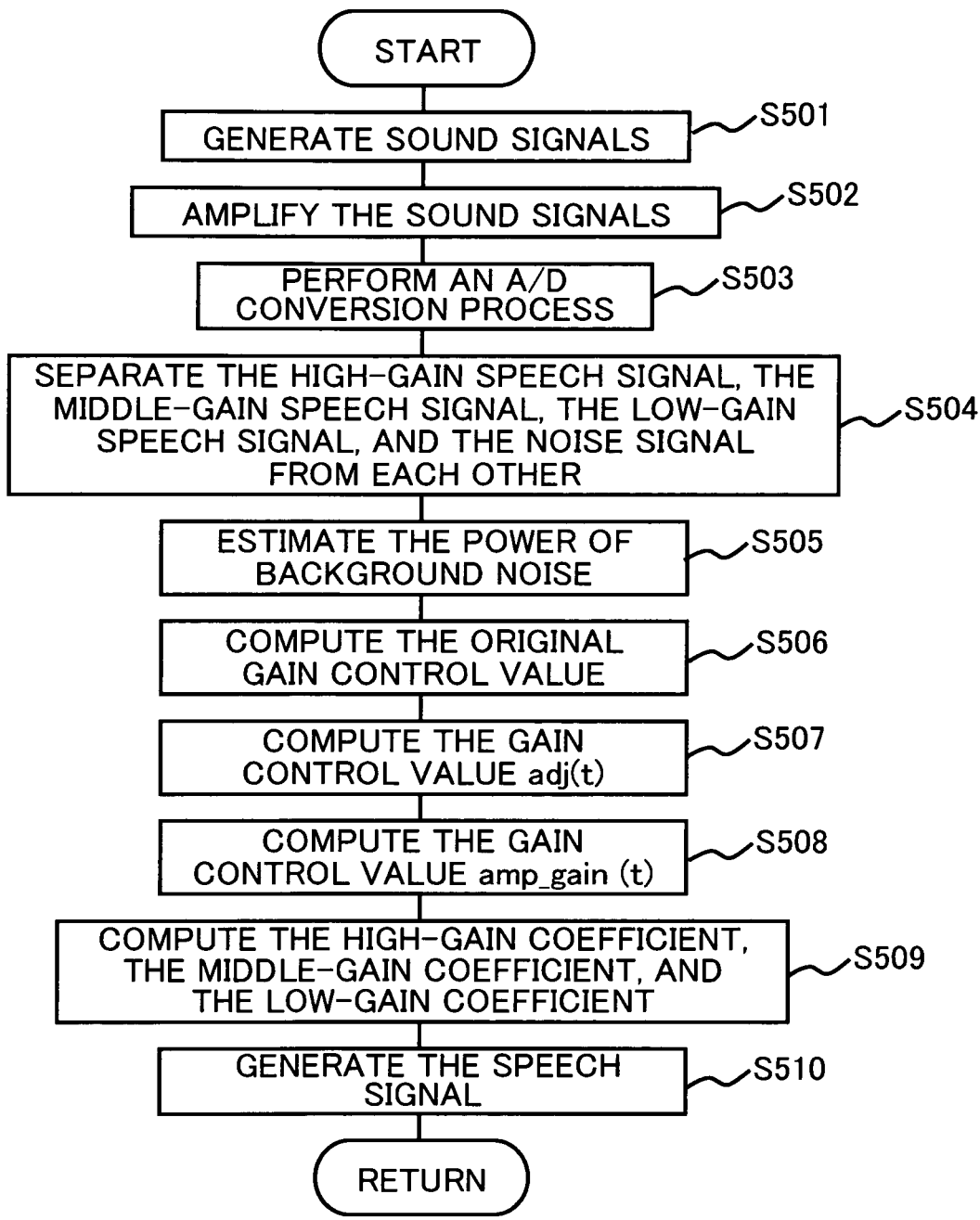
FIG. 17 is an operation chart of exemplary processing performed by the sound processing apparatus according to the fifth exemplary embodiment of the present invention.

Exemplary processing performed by the sound processing apparatus 1 according to the fifth embodiment of the present invention is described next. FIG. 17 is an operation chart of exemplary processing performed by the sound processing apparatus 1 according to the fifth exemplary embodiment of the present invention. The sound processing apparatus 1 generates sound signals on the basis of the sounds received by the first sound receiving unit 10a and the second sound receiving unit 10b (S501), and outputs the generated sound signals to the first amplifier units 11a and 11a, the second amplifier units 11b and 11b, and the third amplifier units 11c and 11c.

The first amplifier units 11a and 11a, the second amplifier units 11b and 11b, and the third amplifier units 11c and 11c of the sound processing apparatus 1 amplify the sound signals generated by the sound receiving units 10 and 10 with their fixed gains (S502), and outputs the amplified sound signals to the corresponding A/D converters 12, 12, . . . .

The A/D converters 12, 12, . . . of the sound processing apparatus 1 perform an A/D conversion process (S503) and outputs the first high-gain input signal in_1_H(t), the second high-gain input signal in_2_H(t), the first middle-gain input signal in_1_M(t), the second middle-gain input signal in_2_M(t), the first low-gain input signal in_1_L(t), and the second low-gain input signal in_2_L(t) to the control unit 13.

Through the process performed by the separating part 130, 130, . . . , the control unit 13 of the sound processing apparatus 1 separates the high-gain speech signal signal_H(t), the middle-gain speech signal signal_M(t), the low-gain speech signal signal_L(t), and the noise signal noise(t) from each other (S504).

Through the process performed by the estimating part 131, the control unit 13 of the sound processing apparatus 1 estimates the power of background noise pow_noise(n) on the basis of the correlation between the low-gain speech signal signal_L(t) and the noise signal noise(t) (S505) and computes the original gain control value adj'(n) on the basis of the power of background noise pow_noise(n) and the power target value ref (S506). The control unit 13 then computes the gain control value adj(t) by smoothing the time variation in the computed original gain control value adj'(n) (S507).

Furthermore, the control unit 13 of the sound processing apparatus 1 computes, through the process performed by the estimating part 131, the gain control value amp_gain(t) on the basis of the gain control value adj(t) (S508). The control unit 13 then computes the high-gain coefficient select_gain_H(t), the middle-gain coefficient select_gain_M(t), and the low-gain coefficient select_gain_L(t) on the basis of the gain control value amp_gain(t) and the gain table 132a (S509). Subsequently, the control unit 13 outputs the computed high-gain coefficient select_gain_H(t), the middle-gain coefficient select_gain_M(t), and the low-gain coefficient select_gain_L(t) to the selecting part 134.

Still furthermore, the control unit 13 of the sound processing apparatus 1 generates, through the process performed by the selecting part 134, the speech signal (t) from the high-gain speech signal signal_H(t), the middle-gain speech signal signal_M(t), the low-gain speech signal signal_L(t), the high-gain coefficient select_gain_H(t), the middle-gain coefficient select_gain_M(t), and the low-gain coefficient select_gain_L(t) (S510). In operation S510, at least one speech signal that is a target of processing is selected from among sound signals amplified with their own gains and, if a plurality of speech signals are selected, speech signals having corrected levels in accordance with the coefficients are generated. That is, if one of the coefficients is "1", a speech signal relating to the coefficient is generated as a speech signal signal(t) for a processing target. For example, when the high-gain coefficient select_gain_H(t) is "1", the middle-gain coefficient select_gain_M(t) is "0", and the low-gain coefficient select_gain_L(t) is "0", the high-gain speech signal signal_H(t) is set to a signal(t) that is a processing target. Alternatively, if a plurality of coefficients greater than "0" and less than "1" are present, a speech signal signal(t) is generated by combining the speech signals relating to these coefficients in a proportion indicated by the coefficients. For example, when the high-gain coefficient select_gain_H(t) is "0", the middle-gain coefficient select_gain_M(t) is "0.4", and the low-gain coefficient select_gain_L(t) is "0.6", a speech signal signal(t) is generated by weighted averaging the middle-gain speech signal signal_M(t) and the low-gain speech signal signal_L(t) in the proportion 4:6. Alternatively, in place of selecting a sound signal, the selecting part 134 may select the amplifier units 11 and 11 and allow only the selected amplifier units 11 and 11 to operate so as to generate the speech signal signal(t). The speech signal signal(t) generated in operation S510 is output to the application part 133. The application part 133 performs a speech recognition process or a voice communication process on the basis of the speech signal signal(t).

Sixth Exemplary Embodiment

In a sixth exemplary embodiment, the application part of the first exemplary embodiment performs processing while taking into account a gain. Since an exemplary hardware configuration of the sixth exemplary embodiment is the same as that of the first exemplary embodiment, the description is not repeated. In the following description, similar numbering is used in describing a similar component as was utilized above in describing the first exemplary embodiment.

Figure 18:
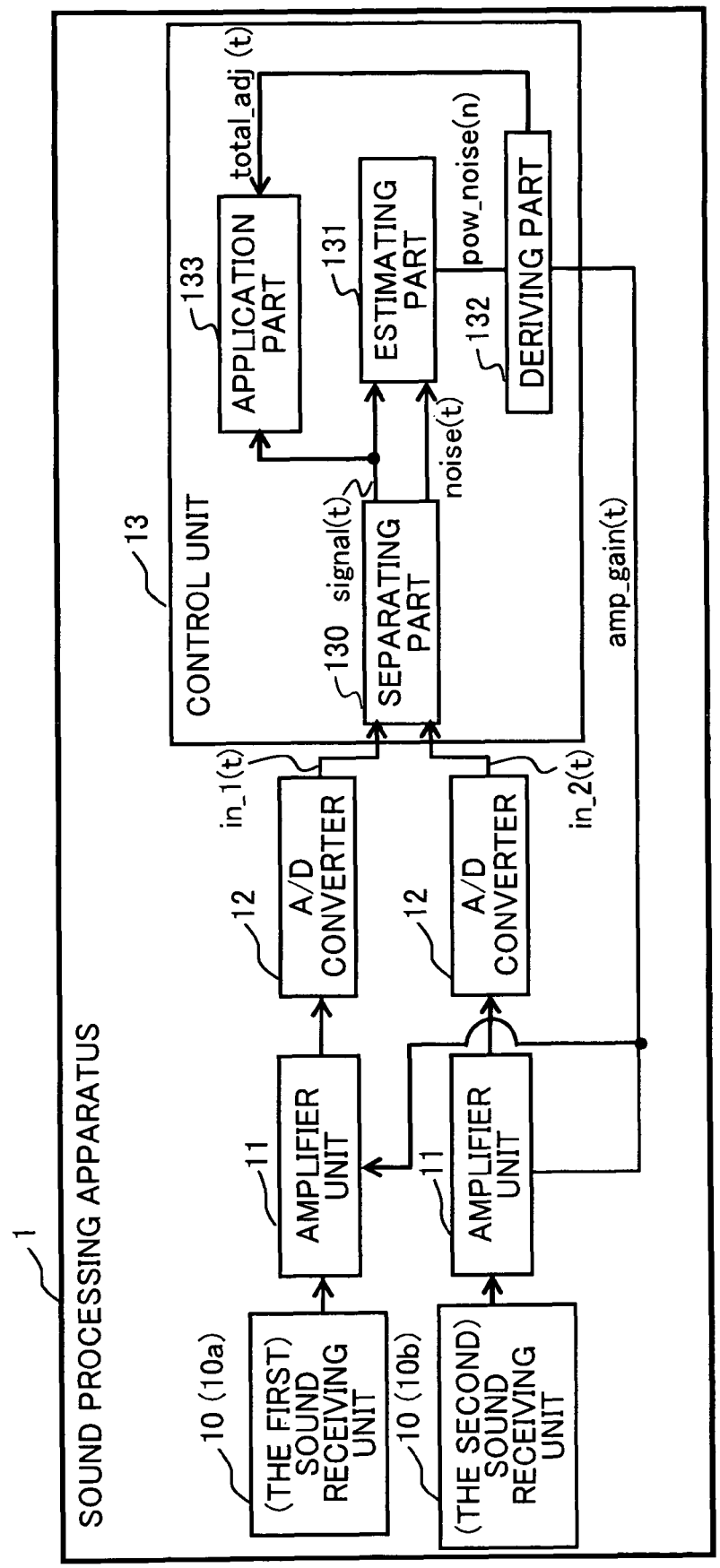
FIG. 18 is a functional block diagram of an exemplary feature of a sound processing apparatus according to a sixth exemplary embodiment of the present invention.

FIG. 18 is a functional block diagram of an exemplary feature of the sound processing apparatus 1 according to the sixth exemplary embodiment of the present invention. By executing the computer program 100 according to the embodiment of the present invention, the control unit 13 generates program modules functioning as: separating part 130, estimating part 131, deriving part 132, and application part 133.

Signal processing performed by the sound processing apparatus 1 according to the sixth exemplary embodiment is described next. As described in the first to fifth exemplary embodiments, in the sound processing apparatus 1, the gain of the speech signal signal(t) input to the application part 133 is dynamically changed for the gain control performed by the amplifier units 11 and 11. Accordingly, the sound processing apparatus 1 of the sixth exemplary embodiment outputs the gain control value amp_gain(t) computed by the deriving part 132 to the amplifier units 11 and 11. At the same time, the sound processing apparatus 1 outputs the accumulation value total_adj(t), which is an accumulation value of the gain control value adj(t), to the application part 133. The gain control value amp_gain(t) and the accumulation value total_adj(t) can be obtained by using the method for computing a gain control value amp_gain(t) and an accumulation value total_adj(t) described in the fourth exemplary embodiment.

Subsequently, the application part 133 corrects the speech signal signal(t) by taking into account the gain indicated by the accumulation value total_adj(t) of the gain control value adj(t). The application part 133 then performs a speech recognition process or a voice communication process on the basis of the corrected speech signal signal(t).

Seventh Exemplary Embodiment

In a seventh exemplary embodiment, a speech signal corrected by taking into account the gain is input to application part of the sixth exemplary embodiment which is an expansion of the first exemplary embodiment. Since an exemplary hardware configuration of the seventh exemplary embodiment is the same as that of the first exemplary embodiment, the description is not repeated. In the following description, similar numbering is used in describing a similar component as was utilized above in describing the sixth exemplary embodiment.

Figure 19:
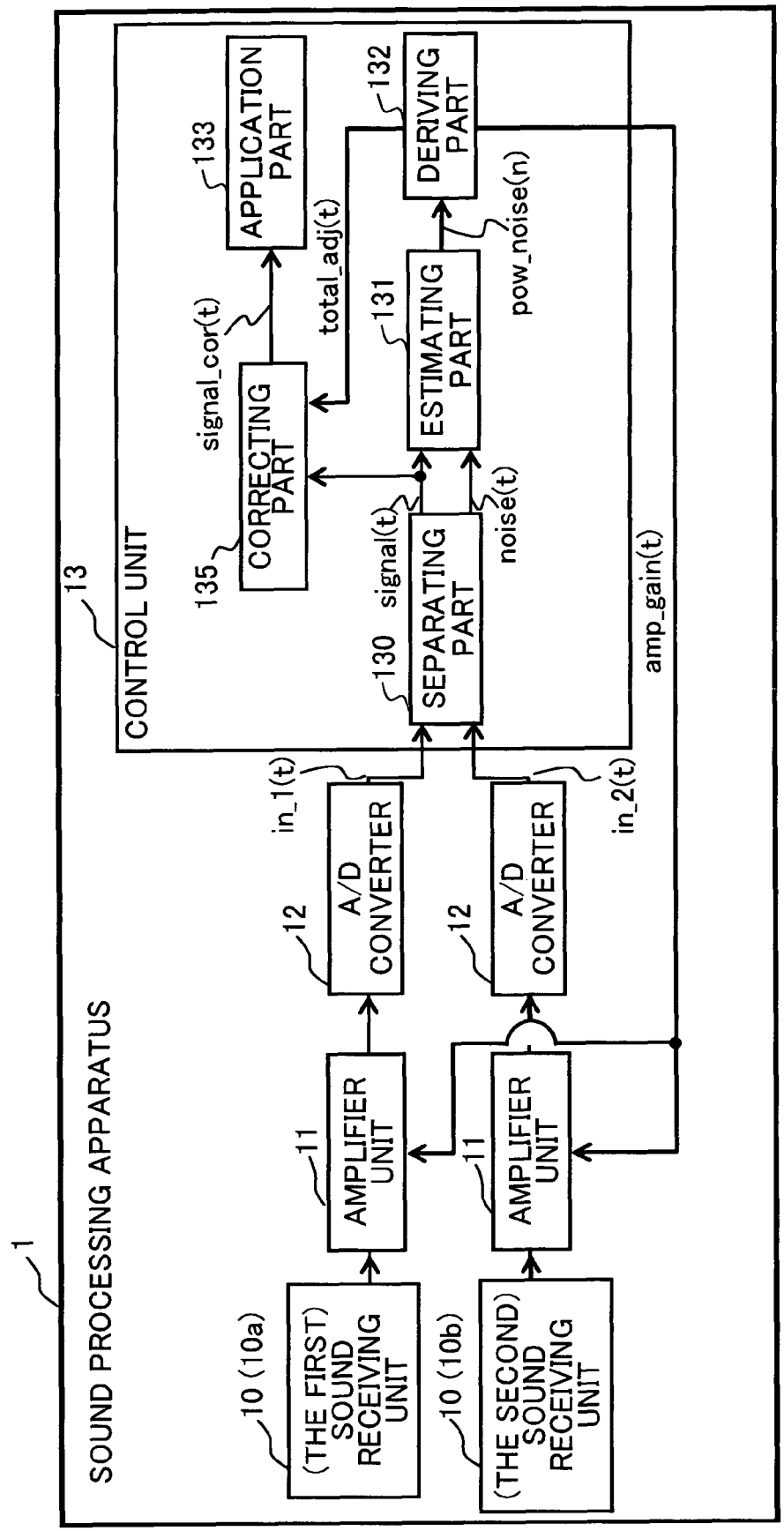
FIG. 19 is a functional block diagram of an exemplary feature of a sound processing apparatus according to a seventh exemplary embodiment of the present invention.

FIG. 19 is a functional block diagram of an exemplary feature of the sound processing apparatus 1 according to the seventh exemplary embodiment of the present invention. By executing the computer program 100 according to the embodiment of the present invention, the control unit 13 generates program modules functioning as: separating part 130, estimating part 131, deriving part 132, application part 133, and correcting part 135 for correcting a speech signal signal(t).

Signal processing performed by the sound processing apparatus 1 according to the seventh exemplary embodiment is described next. In the sound processing apparatus 1 according to the seventh exemplary embodiment, the separating part 130 outputs a speech signal signal(t) to the correcting part 135. In addition, the deriving part 132 outputs the accumulation value total_adj(t) of the gain control value adj(t) to the correcting part 135.

The correcting part 135 computes a correction value gain_cor(t) of the gain using the following equation:

$$\text{gain\_cor}(t) = 10^{-\text{total\_adj}(t)/10} \quad (11)$$

where gain_cor(t) is a correction value of a gain, and total_adj(t) is the accumulation value of the gain control value adj(t).

Furthermore, the correcting part 135 generates a correction signal signal_cor(t) by correcting the speech signal signal(t) using the following equation:

$$\text{signal\_cor}(t) = \text{gain\_cor}(t) \cdot \text{signal}(t) \quad (12)$$

where signal_cor(t) is a correction signal.

Subsequently, the correcting part 135 outputs the correction signal signal_cor(t) to the application part 133. The application part 133 performs a speech recognition process or a voice communication process on the basis of the correction signal signal_cor(t).

Eighth Exemplary Embodiment

An eighth exemplary embodiment is achieved by configuring a system corresponding to the sound processing apparatus according to the first exemplary embodiment using a plurality of apparatuses. In the following description, similar numbering is used in describing a similar component as was utilized above in describing the first exemplary embodiment.

Figure 20:
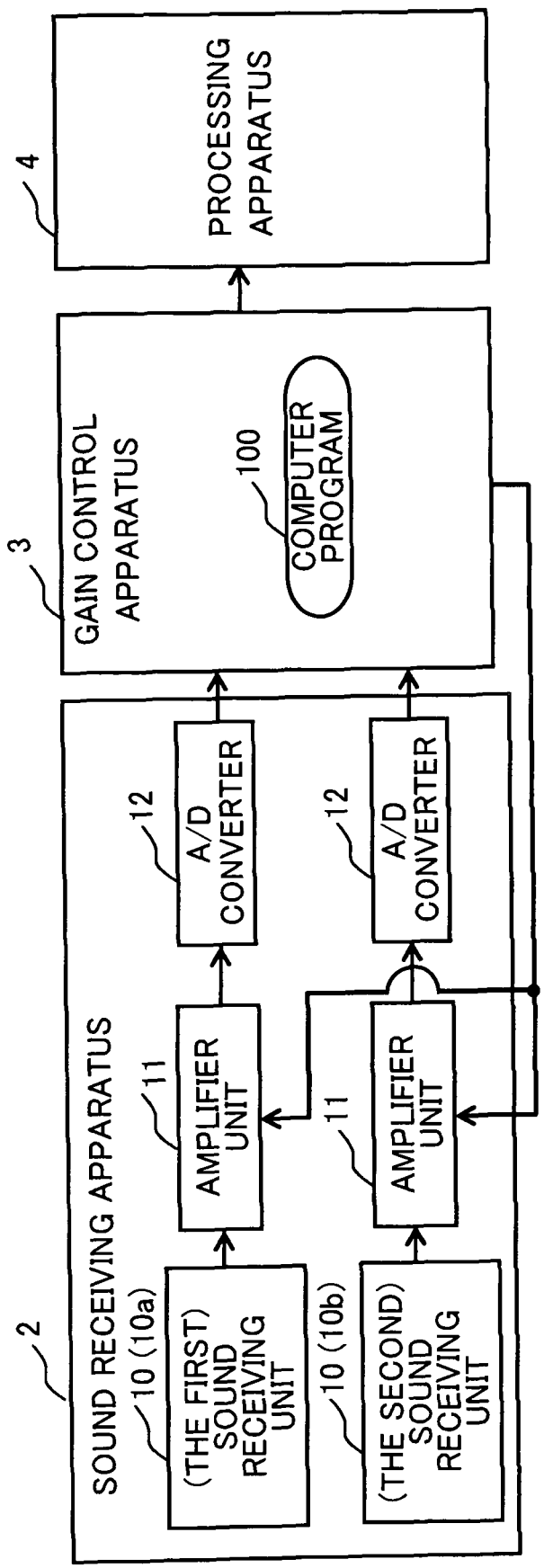
FIG. 20 is a block diagram of an exemplary hardware configuration of a sound processing system according to an eighth exemplary embodiment of the present invention.

FIG. 20 is a block diagram of an exemplary hardware configuration of a sound processing system according to the eighth exemplary embodiment of the present invention. According to the eighth exemplary embodiment of the present invention, the sound processing system includes a sound receiving apparatus 2 having sound receiving units 10 and 10, amplifier units 11 and 11, and the A/D converters 12 and 12, a gain control apparatus 3 such as a DSP, and a processing apparatus 4 for performing, for example, a speech recognition process or a voice communication process.

Figure 21:
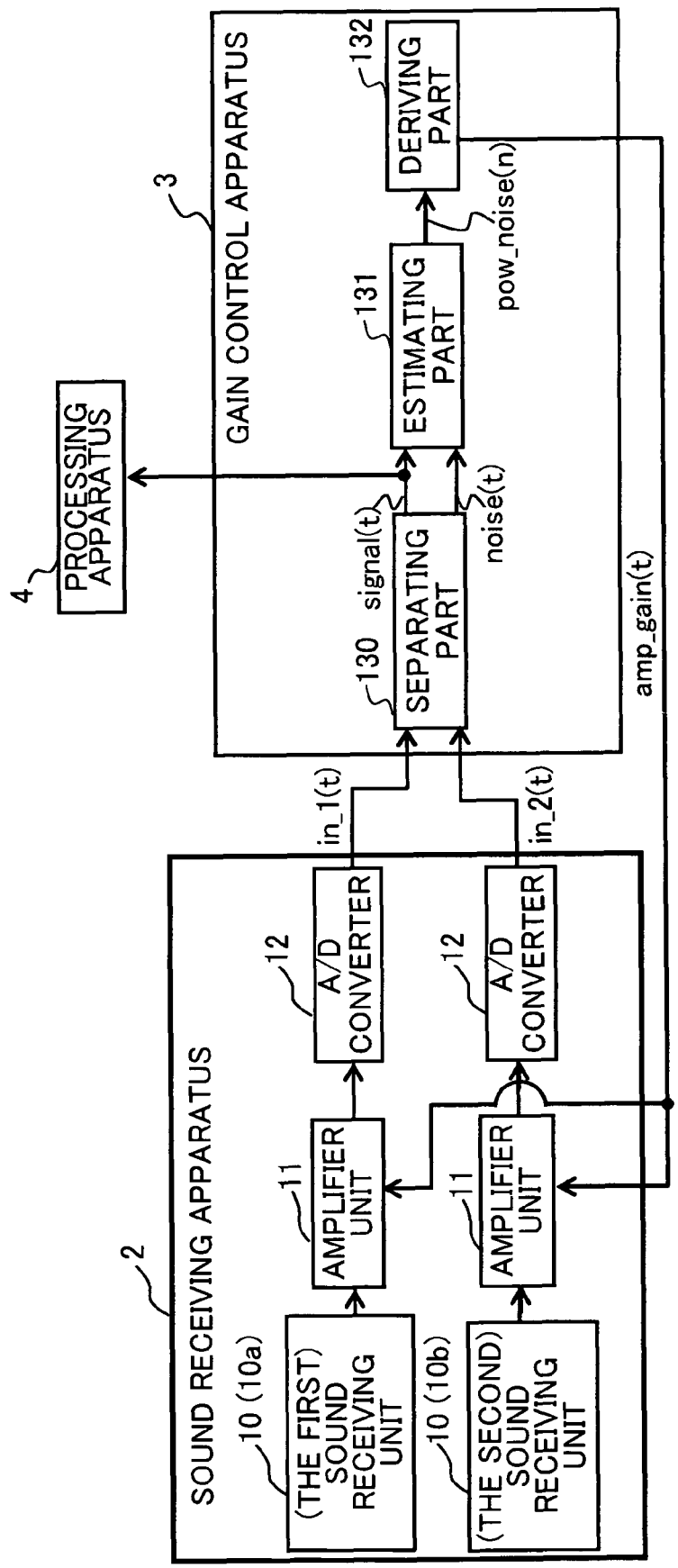
FIG. 21 is a functional block diagram of an exemplary feature of the sound processing system according to the eighth exemplary embodiment of the present invention.
Figure 22:
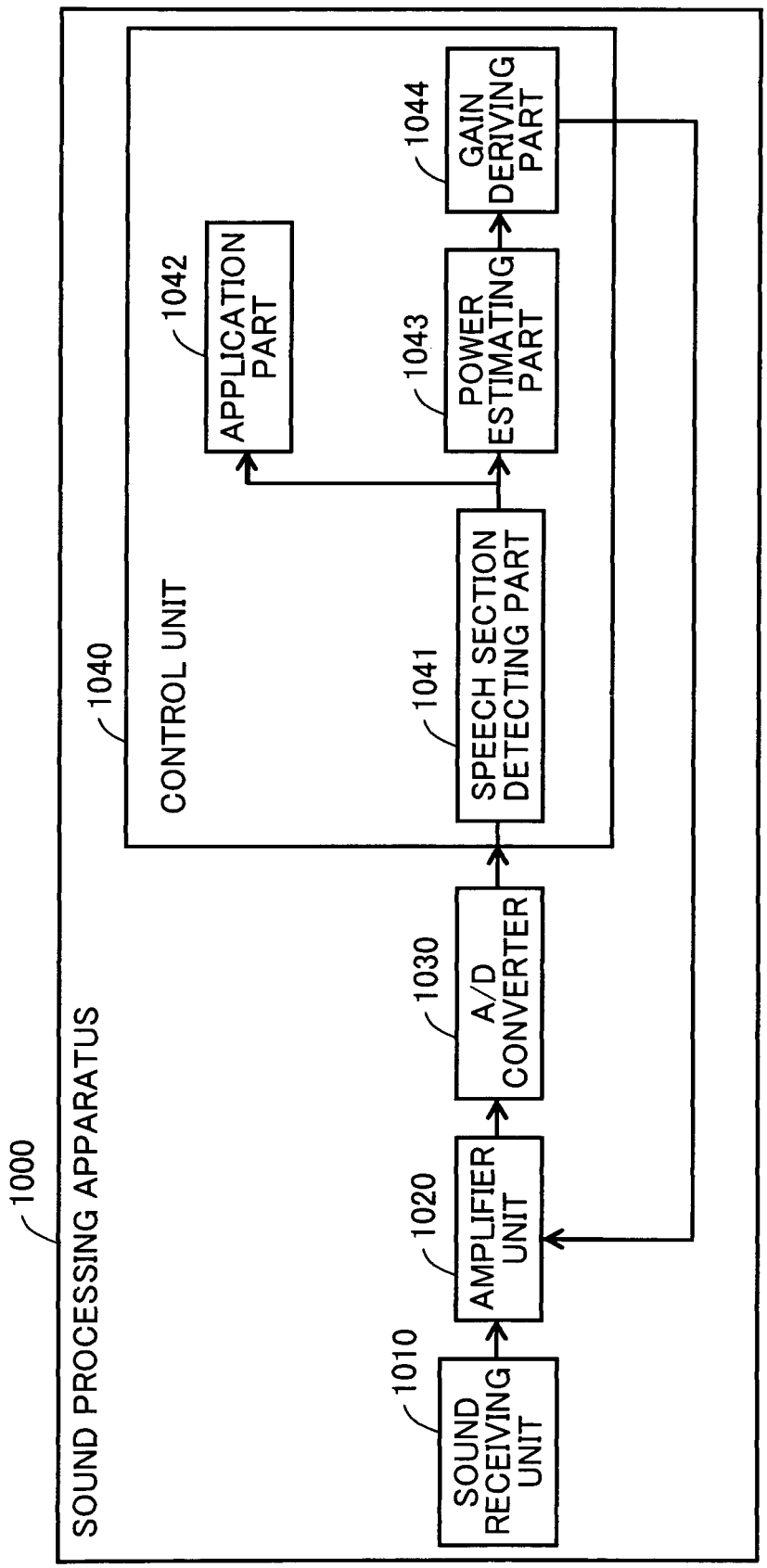
FIG. 22 is a functional block diagram of an existing sound processing apparatus.

FIG. 21 is a functional block diagram of an exemplary feature of the sound processing system according to the eighth exemplary embodiment of the present invention. The gain control apparatus 3 functions as separating part 130, estimating part 131, and deriving part 132. The processing apparatus 4 functions as application part 133 of the first exemplary embodiment for performing, for example, a speech recognition process or a voice communication process.

Since the operations of the apparatuses according to the eighth exemplary embodiment are similar to the corresponding configurations of the first exemplary embodiment, descriptions thereof are not repeated.

It should be understood that the above-described first to eighth exemplary embodiments are only examples of a lot of embodiments of the invention. The hardware and software configurations can be appropriately determined. In addition, a variety of processes can be combined in addition to the above-described basic processes. Furthermore, some of or all of the above-described first to eighth exemplary embodiments can be combined as needed.

What is claimed is:

1. A sound processing apparatus for processing received sounds comprising:
   a plurality of sound receiving units, each of the sound receiving units receiving a sound and converting the sound to a sound signal;
   a plurality of amplifiers, each of the amplifiers controlling a gain for amplifying the sound signal on the basis of a predetermined gain control value;
   a separating part for separating the sound signals converted by the sound receiving units into a first sound signal corresponding to sound from a predetermined direction and a second sound signal corresponding to sound from the other directions than the predetermined direction;
   an estimating part for estimating power of background noise included in the first sound signal and the second sound signal on the basis of correlation between the first and second sound signals separated by the separating part; and
   a deriving part for deriving a gain control value output to the amplifiers on the basis of the power of background noise and a predetermined power target value.

2. The sound processing apparatus according to claim 1, wherein the deriving part computes a difference between the power of background noise and the predetermined target power value and the gain control value by smoothing a time variation in the difference.

3. The sound processing apparatus according to claim 2, wherein the deriving part computes a time constant representing a degree of smoothness on the basis of a size relationship between the computed difference and a previously obtained gain control value, and smoothes the time variation in the difference on the basis of the time constant.

4. The sound processing apparatus according to claim 1, wherein the deriving part computes a gain control value only when the estimated power of background noise is greater than the power target value or only when the estimated power of background noise is less than the power target value.

5. The sound processing apparatus according to claim 1, wherein the deriving part computes a gain control value within a range according to a property of the amplifiers.

6. A sound processing apparatus for processing received sounds, comprising:
   a plurality of sound receiving units, each of a sound receiving units receiving first and second sounds and outputting first and second sound signals corresponding to the received first and second sounds, respectively;
   a plurality of amplifiers, each of amplifiers amplifying the first and second sound signals on the basis of a gain control value;
   a separating part for separating third and fourth sound signals on the basis of the first and second sound signals amplified by each of the amplifiers, the third sound signal being corresponding to sound from a predetermined direction, the fourth sound being corresponding to sound from the other directions than the predetermined direction;
   a estimating part for estimating power of background noise included in the third and fourth sound signals on the basis of correlation between the third and fourth sound signals;
   a deriving part for deriving the gain control value output to the pair of amplifiers on the basis of the power of background noise and a predetermined power target value; and
   a selecting part for selecting the first and second sound signals to be processed among a plurality of the first and second signals output from the plurality of the amplifiers on the basis of a target gain and stored each gain value corresponding to each of the amplifiers.

7. A gain control apparatus capable to be connected to a sound receiving apparatus comprising amplifiers for amplifying sound signals received by a plurality of receiving units, the sound signals received under a noise environment, the gain control apparatus comprising:
   a separating part for separating first and second sound signals on the basis of received sound signals amplified by each of the amplifiers, the first sound signal corresponding to sound from a predetermined direction, the second sound corresponding to sound from the other directions than a predetermined direction;
   an estimating part for estimating power of background noise included in the first and second sound signals on the basis of correlation between the first and second sound signals separated by the separating part; and a deriving part for deriving the gain control value output to the pair of amplifiers on the basis of the power of background noise and a predetermined power target value.

8. A method for causing a computer to control gain of amplifiers for amplifying sound signals amplified by the amplifiers and output from sound receivers for receiving sounds, the method comprising operations:

a separating operation for separating third and fourth sound signals on the basis of the sound signals amplified by the amplifiers, the third sound signal being corresponding to sound from a predetermined direction, the fourth sound being corresponding to sound from the other directions than the predetermined direction;

an estimating operation for estimating a power of background noise contained in the sound signals on the basis of a correlation between the third and fourth sound signals; and a computing operation for computing a gain control value to be set to the amplifiers on the basis of the estimated power of background noise and a predetermined power target value.

9. A non-transitory computer readable medium storing a computer program for executing a method on a computer to control gain of amplifiers for amplifying sound signals, which are amplified by the amplifiers, output from sound receivers for receiving sounds, the method comprising:

separating third and fourth sound signals on the basis of the sound signals amplified by the amplifiers, the third sound signal being corresponding to sound from a predetermined direction, the fourth sound being corresponding to sound from the other directions than the predetermined direction;

estimating a power of background noise contained in the sound signals on the basis of a correlation between the third and fourth sound signals; and deriving a gain control value to be set to the amplifiers on the basis of the estimated power of background noise and a predetermined power target value.

10. The non-transitory computer readable medium according to claim 9, wherein the deriving derives a difference the power of background noise and the predetermined target power value and the gain control value by smoothing a time variation in the difference.

* * * * *